(12) United States Patent
Yoo et al.

(10) Patent No.: US 11,296,063 B2
(45) Date of Patent: Apr. 5, 2022

(54) FLEXIBLE LED DISPLAY WITH PROCESSOR UNDER A FOLDED EDGE PORTION

(71) Applicant: LUMENS CO., LTD., Yongin-si (KR)

(72) Inventors: Taekyung Yoo, Yongin-si (KR); Bogyun Kim, Yongin-si (KR); Minpyo Kim, Yongin-si (KR); Jugyeong Mun, Yongin-si (KR)

(73) Assignee: LUMENS CO., LTD., Yongin-si (KR)

( * ) Notice: Subject to any disclaimer, the term of this patent is extended or adjusted under 35 U.S.C. 154(b) by 231 days.

(21) Appl. No.: 16/684,590

(22) Filed: Nov. 15, 2019

(65) Prior Publication Data

US 2020/0161287 A1 May 21, 2020

(30) Foreign Application Priority Data

Nov. 20, 2018 (KR) .......................... 10-2018-0143444
Dec. 13, 2018 (KR) .......................... 10-2018-0161025
Jan. 14, 2019 (KR) .......................... 10-2019-0004505
Apr. 3, 2019 (KR) .......................... 10-2019-0039166

(51) Int. Cl.
| | |
|---|---|
| *H01L 33/00* | (2010.01) |
| *H01L 29/20* | (2006.01) |
| *H01L 25/16* | (2006.01) |
| *H01L 25/075* | (2006.01) |
| *H01L 33/62* | (2010.01) |
| *H01L 23/538* | (2006.01) |

(52) U.S. Cl.
CPC ........ *H01L 25/167* (2013.01); *H01L 23/5387* (2013.01); *H01L 25/0753* (2013.01); *H01L 33/62* (2013.01); *H01L 2933/0066* (2013.01)

(58) Field of Classification Search
CPC ... H01L 25/167; H01L 25/0753; H01L 33/62; H01L 23/5387; H01L 2933/0066; G09F 9/301

See application file for complete search history.

(56) References Cited

U.S. PATENT DOCUMENTS

| | | | | |
|---|---|---|---|---|
| 2004/0209400 | A1* | 10/2004 | Meyers | ................... H01L 25/50 438/109 |
| 2011/0291302 | A1* | 12/2011 | Mueller | ................... H01L 24/75 257/783 |
| 2017/0170255 | A1* | 6/2017 | Ha | ....................... H01L 27/3276 |
| 2017/0263873 | A1* | 9/2017 | Zhang | ................... H01L 27/326 |
| 2021/0064090 | A1* | 3/2021 | Wen | ..................... G09G 3/3685 |

* cited by examiner

*Primary Examiner* — Ismail A Muse
(74) *Attorney, Agent, or Firm* — Mei & Mark LLP

(57) ABSTRACT

Disclosed is an LED display panel including inner LED display modules and outer LED display modules. Each of the inner LED display modules and the outer LED display modules includes a first flexible circuit board and a second flexible circuit board arrayed in a row in the lengthwise direction and on which LEDs are arrayed, and an upper viscoelastic film and a lower viscoelastic film bonded to each other through the first flexible circuit board and the second flexible circuit board. Each of the first flexible circuit board and the second flexible circuit board includes a folded edge portion and an unfolded edge portion opposite to the folded edge portion. A controller unit is disposed under the folded edge portion to control the LEDs. The folded edge portion of the first flexible circuit board faces the folded edge portion of the second flexible circuit board in each of the inner LED display modules.

20 Claims, 23 Drawing Sheets

(a)　　　　　　　　　(b)

FLEXIBLE LED DISPLAY WITH PROCESSOR UNDER A FOLDED EDGE PORTION

BACKGROUND OF THE INVENTION

1. Field of the Invention

The present invention relates to flexible LED display modules and LED display panels including the same.

2. Description of the Related Art

FIGS. 32 and 33 illustrate flexible LED displays according to Prior Art 1 and Prior Art 2, respectively.

In the flexible LED display illustrated in FIG. 32, an LED board 1 is connected to a control board 2 through connectors 3. The LED board 1 includes a circuit board 11 and a plurality of LEDs 12 mounted on the circuit board 11. When the flexible LED display is bent, the connectors 3 are likely to cause cracks in the connection portion between the LED board 1 and the control board 2, with the result that the LED board 1 may be separated from the control board 2.

Referring to FIG. 33, the flexible LED display includes a flexible circuit board 11, LEDs 12 mounted on the upper surface of the flexible circuit board 11, drive ICs 4 mounted on the bottom surface of the flexible circuit board 11, and an external control board 5 separated from the flexible circuit board 11. The flexible LED display has problems caused by heat generated when the LEDs are driven. Other problems are encountered due to the large thickness of the flexible LED display and its resulting heavy weight.

The flexible circuit board 11 mounted with the LEDs has a multilayer structure consisting of 6 or more layers. Electrodes disposed on the upper and bottom surfaces of the flexible circuit board 11 are provided as plating layers and are exposed to the outside. The plating layers are apt to crack due to their susceptibility to bending. Furthermore, the plating layers, particularly the copper plating layers, are easily oxidized in the external environment. Once oxidized, the plating layers become hard, increasing the risk of cracking.

In an attempt to solve the problems of poor durability and insufficient elasticity of flexible circuit boards, the present applicant has proposed an LED display module having a structure in which a flexible circuit board is sandwiched between an upper viscoelastic film and a lower viscoelastic film. In this structure, the bonding strength between the upper viscoelastic film and the lower viscoelastic film, which are made of the same or similar viscoelastic materials, can be maintained at a high level. However, the bonding strength between the upper viscoelastic film and the upper surface of the flexible circuit board and the bonding strength between the lower viscoelastic film and the lower surface of the flexible circuit board are relatively low. Moreover, the bonding strengths may be further reduced due to different heights around LED pixels or LED chips.

SUMMARY OF THE INVENTION

The present invention has been made in view of the problems of the prior art, and one object of the present invention is to provide a flexible LED display module in which a flexible circuit board is bent such that edge portions of the flexible circuit board mounted with controller units are hidden under a main portion of the flexible circuit board mounted with LEDs but the flexible circuit board is free of cracks or damage despite its bending.

A further object of the present invention is to provide a flexible LED display module in which LEDs and controller units are integrated with a flexible circuit board and the controller units are disposed at the edges of the flexible circuit board, enabling the fabrication of a bezel-less display.

Another object of the present invention is to provide a flexible LED display module including flexible circuit boards on which LEDs are arrayed wherein a first portion and a second portion are folded on each other to form a folded edge portion at one side of each of the flexible circuit board, LEDs are arranged on the first portions of the folded edge portions, and controller units are arranged on the second portions of the folded edge portions, thus being suitable for use in the construction of a bezel-less LED display panel.

Another object of the present invention is to provide a large-area LED display panel that uses flexible LED display modules provided with controller units on folded edge portions wherein the pitch of LEDs in the flexible LED display modules is the same as the distance between an LED in one of the flexible LED display modules and an adjacent LED in the adjacent flexible LED display module.

Another object of the present invention is to provide a flexible LED display module in which LED controller units or LED light sources are protected from damage when the number of bends or curvatures of a flexible circuit board increases.

Still another object of the present invention is to provide a flexible LED display module in which the bonding strength between an upper viscoelastic film and a flexible circuit board and the bonding strength between a lower viscoelastic film and the flexible circuit board around LED light sources are further improved.

BRIEF DESCRIPTION OF THE DRAWINGS

These and/or other aspects and advantages of the invention will become apparent and more readily appreciated from the following description of the embodiments, taken in conjunction with the accompanying drawings of which.

DETAILED DESCRIPTION OF THE INVENTION

Embodiments of the present invention will now be described with reference to the accompanying drawings.

First Embodiments

Figure 1:
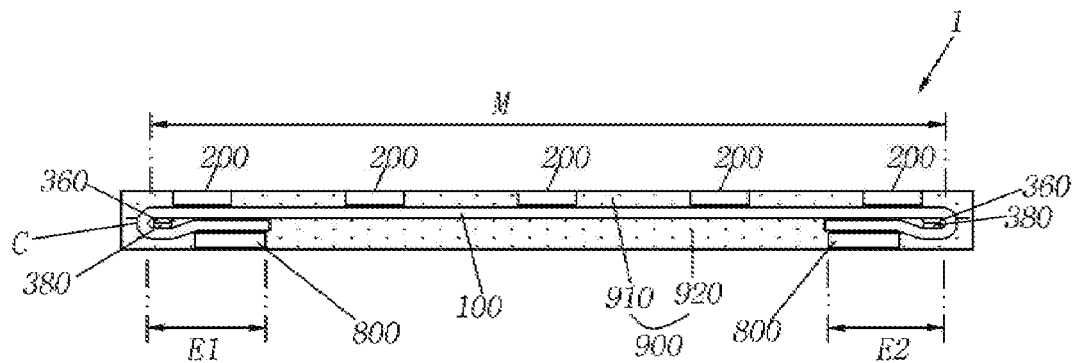
FIG. 1 is a cross-sectional view illustrating a flexible LED display module according to a 1-1$^{st}$ embodiment of the present invention.
Figure 2:
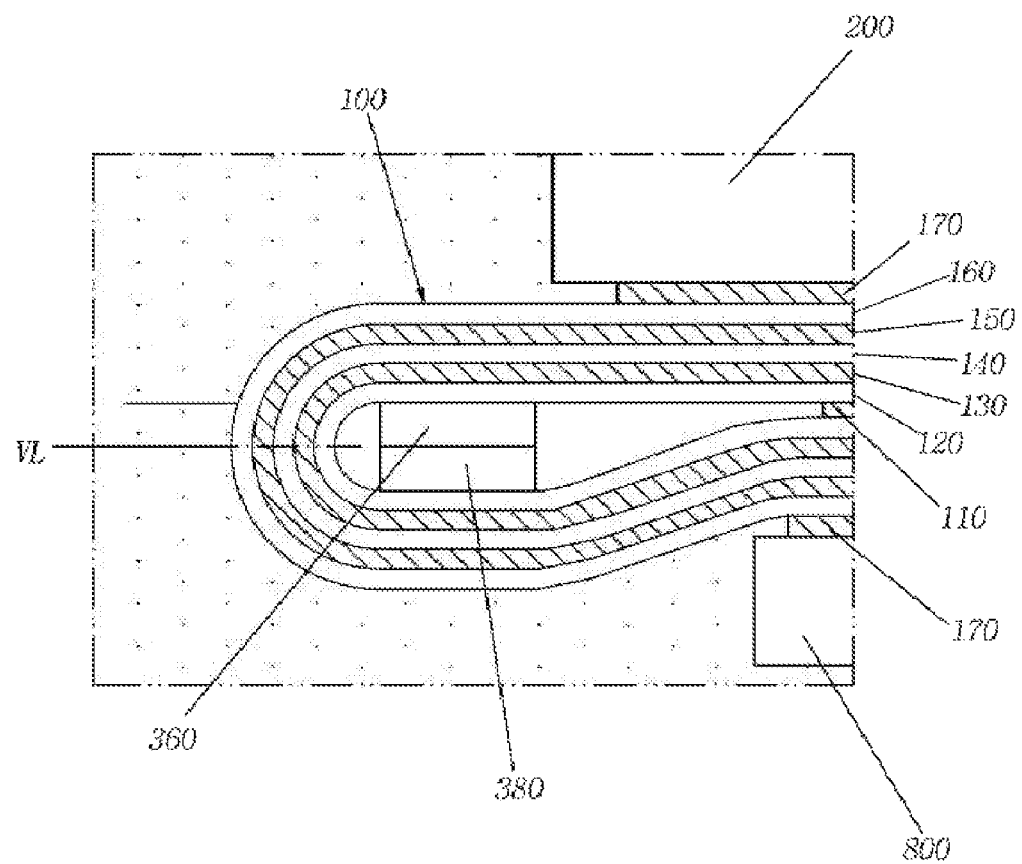
FIG. 2 is a partially enlarged view illustrating the flexible LED display module of FIG. 1.

FIG. 1 is a cross-sectional view illustrating a flexible LED display module according to one embodiment of the present invention. FIG. 2 is a partially enlarged view illustrating the flexible LED display module of FIG. 1.

Referring to FIGS. 1 and 2, the flexible LED display module 1 includes a flexible circuit board 100. The flexible circuit board 100 includes an upper surface and a bottom surface opposite to the upper surface. The flexible LED display module 1 includes a plurality of LEDs 200 and controller units 800 mounted on the upper surface of the flexible circuit board 100.

The flexible circuit board 100 includes curved portions C having predetermined radii of curvature at the left and right sides thereof. The flexible circuit board 100 is divided into a main portion M defined between the curved portions C and edge portions E1 and E2 opposite to the main portion M through the curved portions C. The upper surface of the main portion M is directed upwards and the upper surfaces of the edge portions E1 and E2 are directed downwards. The flexible circuit board 100 is bent such that the edge portions E1 and E2 are folded on the lower surface of the main portion M. The edge portions E1 and E2 are substantially parallel to the main portion M.

The plurality of LEDs 200 are mounted on the upper surface of the main portion M of the flexible circuit board 100 and are directed upwards. The controller units 800 are attached to the upper surfaces of the edge portions E1 and E2 of the flexible circuit board 100. Since the edge portions E1 and E2 are folded on the lower surface of the main portion M by bending to form the curved portions C, the controller units 800 attached to the upper surfaces of the edge portions E1 and E2 are directed downwards, which is a direction opposite to the direction toward which the LEDs 200 are directed.

The flexible LED display module 1 includes a viscoelastic layer 900 covering all exposed areas of the flexible circuit board 100 except for the areas where the LEDs 200 and the controller units 800 are mounted.

As mentioned above, since the main portion M of the flexible circuit board 100 remains intact and the curved portions C are formed by bending, the edge portions E1 and E2 are folded on the lower surface of the main portion M and are substantially parallel to the main portion M. The upper surface of the main portion M is directed upwards both before and after bending, while the upper surfaces of the edge portions E1 and E2 are directed upwards before bending but are directed downwards after bending. Herein, the portion whose upper surface is directed upwards before and after bending is defined as the main portion and the portions whose upper surfaces are directed upwards before bending but are directed downwards after bending are defined as the edge portions.

In addition, the flexible LED display module 1 includes first dummy pads 360 attached to the bottom surface of the main portion M of the flexible circuit board 100 and second dummy pads 380 attached to the bottom surfaces of the edge portions E1 and E2 of the flexible circuit board 100. When the flexible circuit board 100 is bent such that the upper surfaces of the edge portions E1 and E2 of the flexible circuit board 100 are directed downwards, the inner or outer curvatures and the inner or outer radii of curvature of the curved portions C formed between the main portion M and the edge portions E1 and E2 are limited by the first dummy pads 360 and the second dummy pads 380. By the limited curvatures and radii of curvature, circuits of the flexible circuit board 100 are protected from damage caused by bending.

The controller units 800 may be controller boards or drive ICs. For example, the controller unit 800 mounted on the edge portion E1 may be a controller board. In this case, the controller unit 800 mounted on the other the edge portion E2 of the flexible circuit board 100 may be a drive IC.

The viscoelastic layer 900 is formed so as to cover the main portion M, the edge portions E1 and E2, and the curved portions C of the flexible circuit board 100. The viscoelastic layer 900 also covers the bottom surface of the flexible circuit board 100 except for the areas covered with the edge portions E1 and E2 formed by bending the flexible circuit board 100, as well as the upper surface of the flexible circuit board 100.

In this embodiment, the viscoelastic layer 900 may be formed by bonding an upper viscoelastic film 910 to a lower viscoelastic film 920. Each of the upper viscoelastic film 910 and the lower viscoelastic film 920 is preferably a film- or sheet-like urethane rubber. The viscoelastic layer 900 may be formed by arranging the flexible circuit board 100 between the upper viscoelastic film 910 and the lower viscoelastic film 920 and pressing the upper viscoelastic film 910 and the lower viscoelastic film against each other at high temperature ("hot pressing").

The upper viscoelastic film 910 includes through holes into which the LEDs 200 are fitted and through which the LEDs 200 are exposed. The upper surface of the upper viscoelastic film lies at the same level as the upper surfaces of the LEDs 200. The lower viscoelastic film 920 may include closed holes or through holes formed at positions corresponding to the controller units 800 and into which the controller units 800 are fitted. When closed holes are formed, the controller units 800 are covered with the lower viscoelastic film 920 and are thus not exposed to the outside.

The edges of the viscoelastic layer 900 are cut along vertical cutting lines passing through the upper viscoelastic film 910 and the lower viscoelastic film 920. Heat generated by a cutting tool during cutting leads to the disappearance of the boundaries between the upper viscoelastic film 910 and the lower viscoelastic film 920 at the lateral ends of the upper viscoelastic film 910 and the lower viscoelastic film 920.

The flexible circuit board 100 is bent along imaginary vertical bending lines VL located between the first dummy pads 360 and the second dummy pads 380 to form the curved portions having predetermined radii of curvature. The curvatures and the radii of curvature of the curved portions between the portions of the flexible circuit board 100 (i.e. the main portion M and the edge portions E1 and E2), where bending is performed, are limited by the first dummy pads 360 and the second dummy pads 380. For example, when the flexible circuit board 100 is bent along the imaginary vertical bending lines VL, the first dummy pads 360 come into contact with the second dummy pads 380, and thereafter, the flexible circuit board 100 is not bent any more, thus limiting the radii of curvature of the curved portions.

The flexible circuit board 100 includes a lower metal pattern layer 110 and an upper metal pattern layer 170. Intermediate layers, including a first intermediate metal pattern layer 130 and a second intermediate metal pattern layer 150, are formed between the lower metal pattern layer 110 and the upper metal pattern layer 170.

The lower metal pattern layer 110 may be formed by plating Cu, Sn and/or Au on the bottom surface of a lower insulating layer 120 as the lowest intermediate layer in a predetermined pattern. The lower metal pattern layer may be at least partially covered with the lower viscoelastic layer 920. In this case, the lower metal pattern layer may be protected from oxidation. An antioxidation film may be further attached to the lower metal pattern layer.

The upper metal pattern layer 170 may be formed by plating Cu, tin and/or Au on the upper surface of an upper insulating layer 160 as the highest intermediate layer in a predetermined pattern. The upper metal pattern layer 170 may be at least partially covered with the upper viscoelastic layer 910. In this case, the upper metal pattern layer may be protected from oxidation. An antioxidation film may be further attached to the upper metal pattern layer.

In this embodiment, the intermediate layers include a lower insulating layer 120 electrically insulating the lower metal pattern layer 110 and the first intermediate metal pattern layer 130, an intermediate insulating layer 140 electrically insulating the first intermediate metal pattern layer 130 and the second intermediate metal pattern layer 150, and an upper insulating layer 160 electrically insulating the second intermediate metal pattern layer 150 and the upper metal pattern layer 170.

The first intermediate metal pattern layer 130 and the second intermediate metal pattern layer 150 may be, for example, copper films having predetermined patterns. Vias may be formed in the lower insulating layer 120, the upper insulating layer 160, and the intermediate insulating layer 140 to connect the overlying and underlying metal patterns.

Since the lower metal pattern layer 110 and the upper metal pattern layer 170 formed by plating are susceptible to bending, none of the lower metal pattern layer 110 and the upper metal pattern layer 170 are formed in the portions, that is, the curved portions C, where bending is performed between the main portion M and the edge portions E1 and E2.

FIGS. 3 to 6 illustrate a method for constructing a flexible LED display module according to one embodiment of the present invention.

Figure 3:
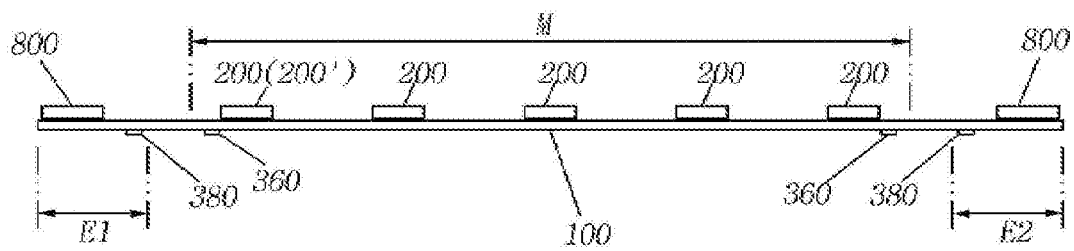
FIGS. 3 to 6 illustrate a method for constructing the flexible LED display module according to the 1-1$^{st}$ embodiment of the present invention.

Referring first to FIG. 3, LEDs 200 are mounted on the upper surface of a main portion M of a flexible circuit board 100 and controller units 800 are mounted on the upper surface of both edge portions E1 and E2 of the flexible circuit board 100. The controller units 800 may be a controller board mounted on one of the edge portions and a drive IC on the other edge portion.

The flexible circuit board 100 may include the laminate structure illustrated in FIG. 2. Second dummy pads 380 are attached to the bottom surfaces of the edge portions E1 and E2 of the flexible circuit board 100 and first dummy pads 360 are attached to the bottom surface of the main portion M of the flexible circuit board 100.

Figure 4:
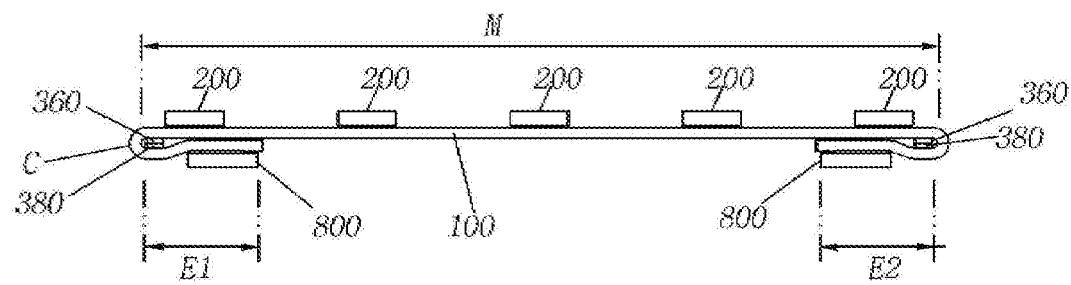

Referring next to FIG. 4, the flexible circuit board 100 is bent such that the upper surfaces of the edge portions E1 and E2 are directed downwards while the main portion M of the flexible circuit board 100 remains intact. The bending of the flexible circuit board 100 at the left and right sides of the main portion M leads to the formation of curved portions C having predetermined inner and outer radii of curvature between the main portion M and the edge portions E1 and E2. The inner and outer radii of curvature (particularly, the outer radius of curvature) of the curved portions C are limited by the first dummy pads 360 and the second dummy pads 380. Here, it is preferable that neither an upper metal pattern layer formed by plating and bonded to the LEDs 200 and the controller units 800 nor a lower metal pattern layer is present in the curved portions C.

Figure 5:
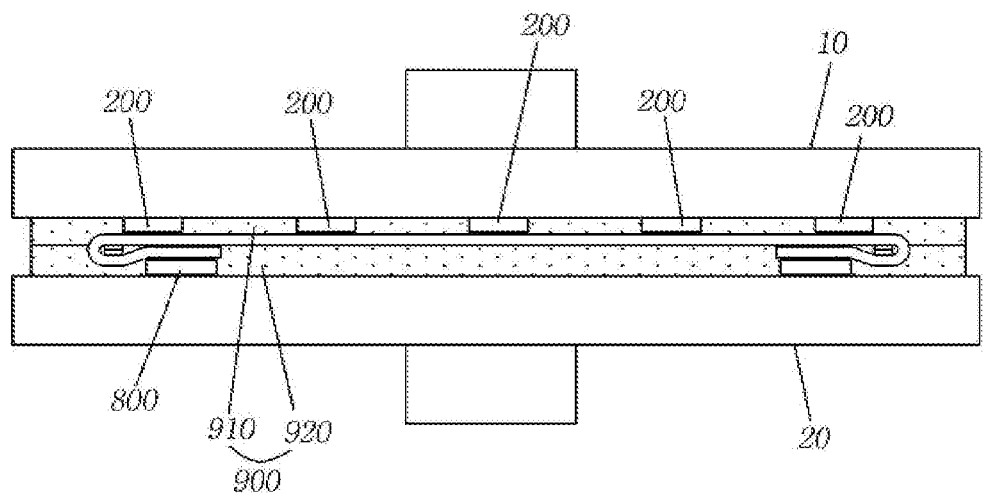

Referring next to FIG. 5, an upper viscoelastic film 910 including first holes (through holes) corresponding to the LEDs 200 is arranged such that the LEDs 200 are inserted into the first holes; and a lower viscoelastic film 920 including second holes (closed holes) corresponding to the controller units 800 is arranged such that the controller units 800 are inserted into the second holes. Then, the lower viscoelastic film 920 and the upper viscoelastic film 910 are pressed against the flexible circuit board 100 by hot pressing using an upper mold 10 and a lower mold 20 to form a viscoelastic layer 900 consisting of the lower viscoelastic film 920 and the upper viscoelastic film 910.

Figure 6:
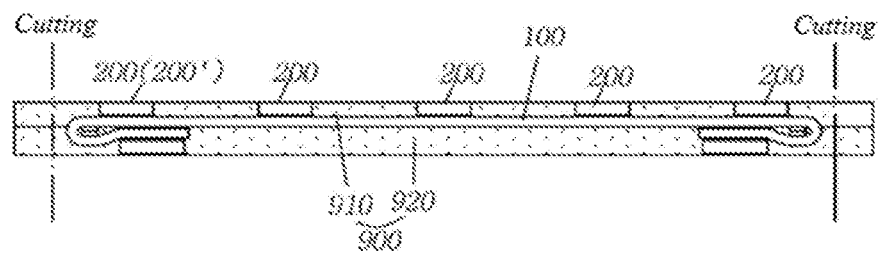

Referring next to FIG. 6, the edges of the viscoelastic layer 900 are cut. Heat generated by a cutting tool during cutting allows borderless connection between the edges of the upper viscoelastic film 910 and the lower viscoelastic film 920. Here, the distance between the edge one 200' of the LEDs 200 and the cut surface of the viscoelastic layer 900 is made smaller than the pitch of the LEDs 200 or the distance between the adjacent LEDs 200. More preferably, the distance between the edge LED and the cut surface of the viscoelastic layer 900 is adjusted to half (½) the pitch of the LEDs.

Figure 7:
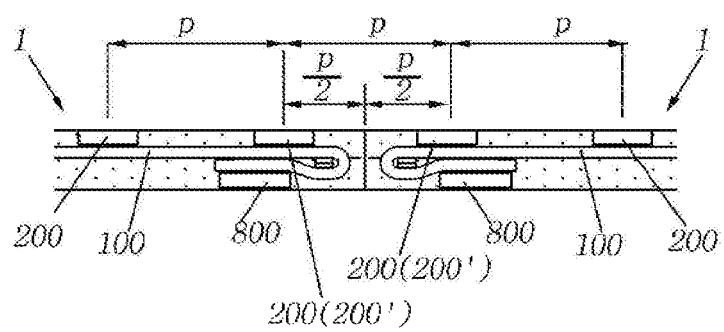
FIG. 7 illustrates an array of flexible LED display modules according to the 1-1$^{st}$ embodiment of the present invention.

FIG. 7 illustrates an array of flexible LED display modules constructed by the method.

Referring to FIG. 7, adjacent flexible LED display modules 1 are arrayed in contact with each other. The pitch P of LEDs 200 (or the distance between the centers of adjacent LEDs 200) in the flexible LED display modules 1 is the same as the pitch P of two adjacent edge LEDs 200 (or the distance between the centers of the LEDs 200) of the two adjacent LED display modules. The distance between the center of the edge LED 200' in one of the flexible LED display module 1 and the lateral end of the flexible LED display module 1, that is, the cut surface at one edge of the viscoelastic layer 900, is half the pitch ("P/2").

The controller units 800 and the LEDs 200 are mounted on the upper surface of the flexible circuit board 100, but the controller units 800 are directed downwards after the bending of the flexible circuit board 100. When the flexible LED display modules are arrayed, the controller units 800 of the outermost flexible LED display module are also hidden under the main portion M of the flexible circuit board 100 mounted with the LEDs 200. Accordingly, the use of the flexible LED display modules enables the fabrication of a bezel-less flexible LED display.

Figure 8:
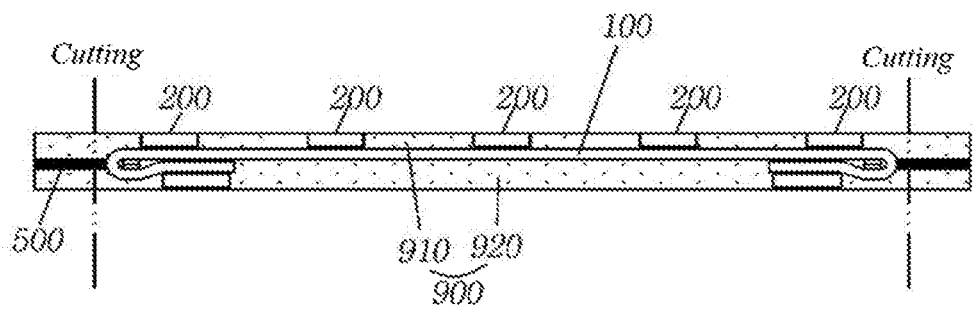
FIG. 8 illustrates a method for constructing a flexible LED display module according to a 1-2$^{nd}$ embodiment of the present invention and a flexible LED display module constructed by the method.

FIG. 8 illustrates a method for constructing a flexible LED display module according to a further embodiment of the present invention and a flexible LED display module constructed by the method.

The steps prior to the formation of a viscoelastic layer in the method according to this embodiment are the same as those in the method according to the previous embodiment (i.e. the steps illustrated in FIGS. 3 and 4).

The method according to the previous embodiment does not use any insertion between the upper viscoelastic film and the lower viscoelastic film in the edge regions where the flexible circuit board is not present. In this case, despite the use of hot processing, it is difficult to ensure reliable adhesion and bonding between the upper viscoelastic film and the lower viscoelastic film in the edge regions where the flexible circuit board is not present. Particularly, this problem becomes more serious with increasing thickness of the flexible circuit board.

In the present embodiment, an insert film 500 is interposed between the upper viscoelastic film 910 and the lower viscoelastic film 920 in the regions where the upper viscoelastic film 910 faces the lower viscoelastic film 920 without the flexible circuit board 100 therebetween, as illustrated in FIG. 8. The insert film compensates for a difference in the gap between the region where the flexible circuit board 100 is not present and the region where the flexible circuit board 100 is present between the upper viscoelastic film 910 and the lower viscoelastic film 920 to assist in reliably pressing and bonding the upper viscoelastic film 910 to the lower viscoelastic film 920 upon hot pressing (not illustrated). After hot pressing, a viscoelastic layer 900 in which the upper viscoelastic film 910, the insert film 500, and the lower viscoelastic film 920 are integrated together can be obtained in the region where the flexible circuit board 100 is not present. Portions of the edges of the viscoelastic layer 900 are cut along cutting lines to minimize the size of the flexible LED display module. In FIG. 8, the cutting lines are denoted by alternate long and two short dashes lines. By heat and pressure applied during cutting, smooth cut surfaces of the viscoelastic layer 900 can be obtained where no boundaries are visible between the upper viscoelastic film 910 and the insert film 500 and between the lower viscoelastic film 920 and the insert film 500.

Figure 9:
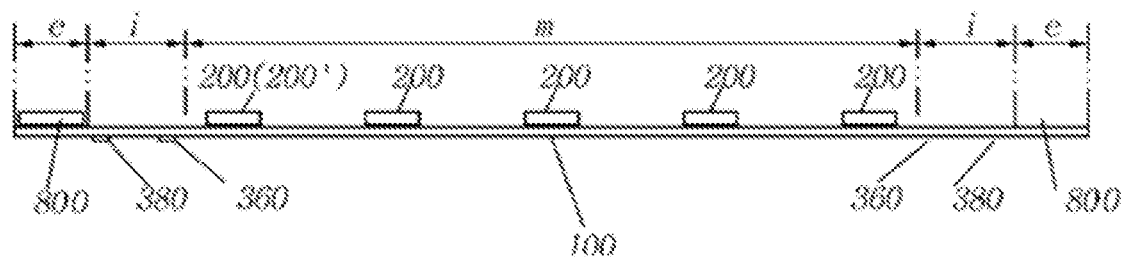
FIG. 9 is a cross-sectional view illustrating a flexible LED display module according to a 1-3$^{rd}$ embodiment of the present invention.

FIG. 9 is a cross-sectional view illustrating a flexible LED display module according to a 1-3$^{rd}$ embodiment of the present invention.

Referring to FIG. 9, the flexible LED display module includes a plurality of LEDs 200 and a flexible circuit board 100 mounted with the LEDs 200. The flexible LED display module includes controller units 800 attached to the upper surface of the flexible circuit board 100.

The flexible circuit board 100 includes three areas, i.e. a main area m in which the LEDs 200 are arrayed, edge areas e in which the controller units 800 are placed to control the LEDs 200, and intermediate areas i located between the main area m and the edge areas e. The intermediate areas i are bent to form curved portions, as in the previous embodiment. Dummy pads 360 and 380 are disposed in the intermediate areas i to limit the curvatures of the curved portions. The dummy pads 360 and 380 are disposed on the bottom surface of the flexible circuit board 100 rather than on the upper surface of the flexible circuit board 100 where the LEDs 200 and the controller units 800 are arranged. The term "main area" used in this embodiment corresponds to the term "main portion" used in the previous embodiment. The "edge areas" used in this embodiment corresponds to the term "edge portions" used in the previous embodiment. The viscoelastic layer used in the previous embodiment is omitted from this embodiment or may also apply similarly or equally to this embodiment. When the viscoelastic layer is applied, it may include an upper viscoelastic film and a lower viscoelastic film bonded to each other by hot pressing, as in the previous embodiment.

Figure 10:
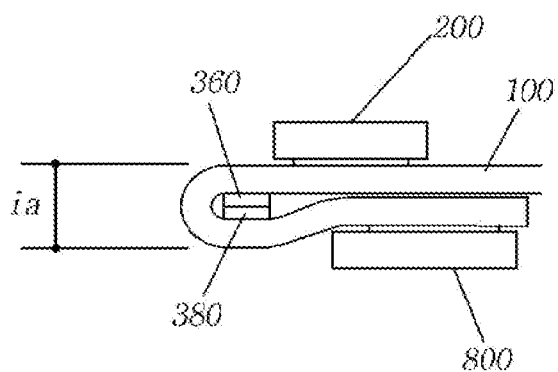
FIG. 10 is an enlarged view illustrating an exemplary dummy pad structure arranged in an intermediate area between a main area and an edge area of the flexible LED display module of FIG. 9.

FIG. 10 is an enlarged view illustrating an exemplary dummy pad structure arranged in the intermediate area between the main area and the edge area of the flexible LED display module of FIG. 9.

Referring to FIG. 10, the intermediate area of the flexible circuit board 100 includes a pad area in which the dummy pads 360 and 380 are disposed and a non-pad area ia in which none of the dummy pads 360 and 380 are disposed. The curved portion is formed in the non-pad area ia. Bending is not performed in the area where the dummy pads 360 and 380 are disposed and is performed only in the non-pad area ia where none of the dummy pads 360 and 380 are disposed to form the curved portion. The dummy pads 360 and 380 are in contact with each other to limit the radius of curvature of the curved portion.

Figure 11:
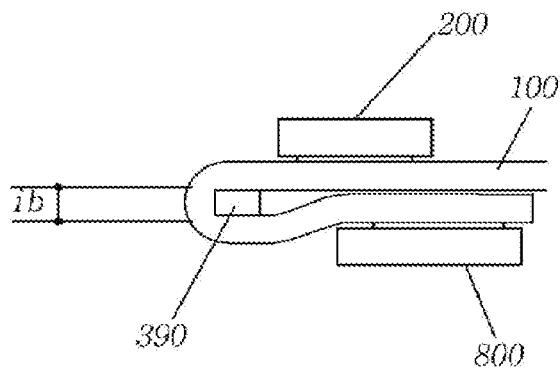
FIG. 11 illustrates an alternative example of the dummy pad structure illustrated in FIG. 10.

FIG. 11 illustrates an alternative example of the dummy pad structure illustrated in FIG. 10.

Referring to FIG. 11, the intermediate area of the flexible circuit board 100 includes a pad area ib in which a dummy pad 39 is disposed and a non-pad area in which the dummy pad 390 is not disposed. The curved portion is formed in the pad area ib. Bending is not performed in the area where the dummy pad 390 is not disposed and is performed only in the pad area ib where the dummy pad 390 is disposed to form the curved portion. Here, the width of the dummy pad 390 may be a factor controlling the radius of curvature of the curved portion.

Second Embodiments

Embodiments of the present invention will be described with reference to the accompanying drawings.

Figure 12:
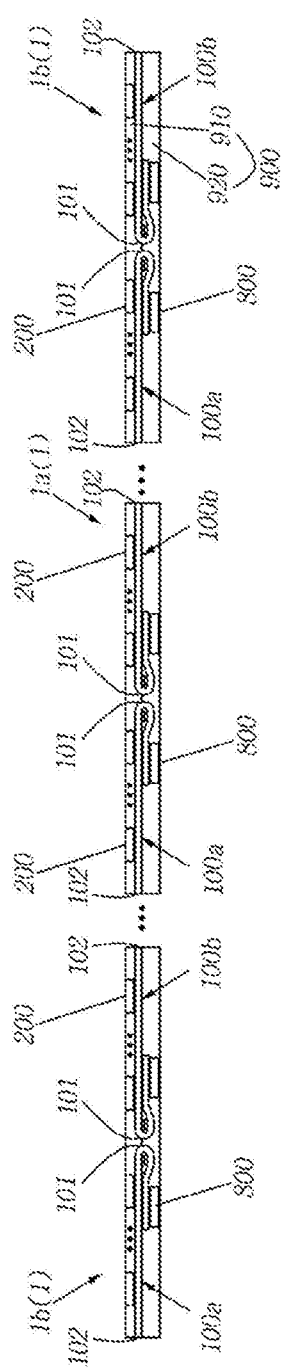
FIG. 12 is a cross-sectional view illustrating an LED display panel according to a 2-1$^{st}$ embodiment of the present invention.
Figure 13:
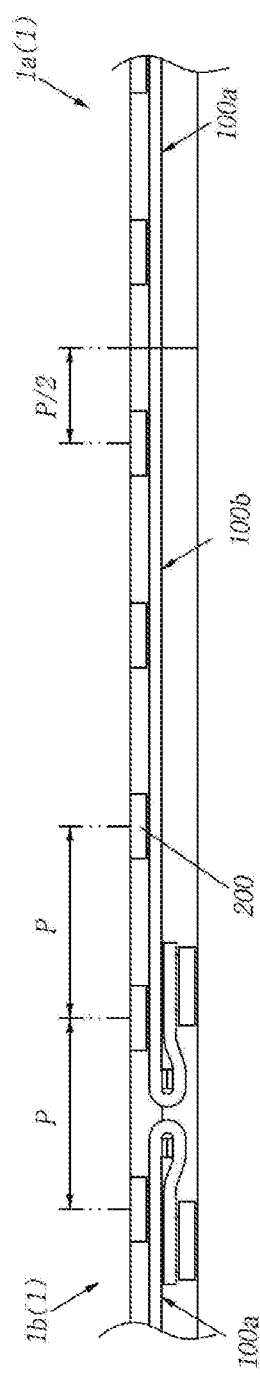
FIG. 13 is a partial cross-sectional view illustrating the LED display panel according to the 2-1$^{st}$ embodiment of the present invention.
Figure 14:
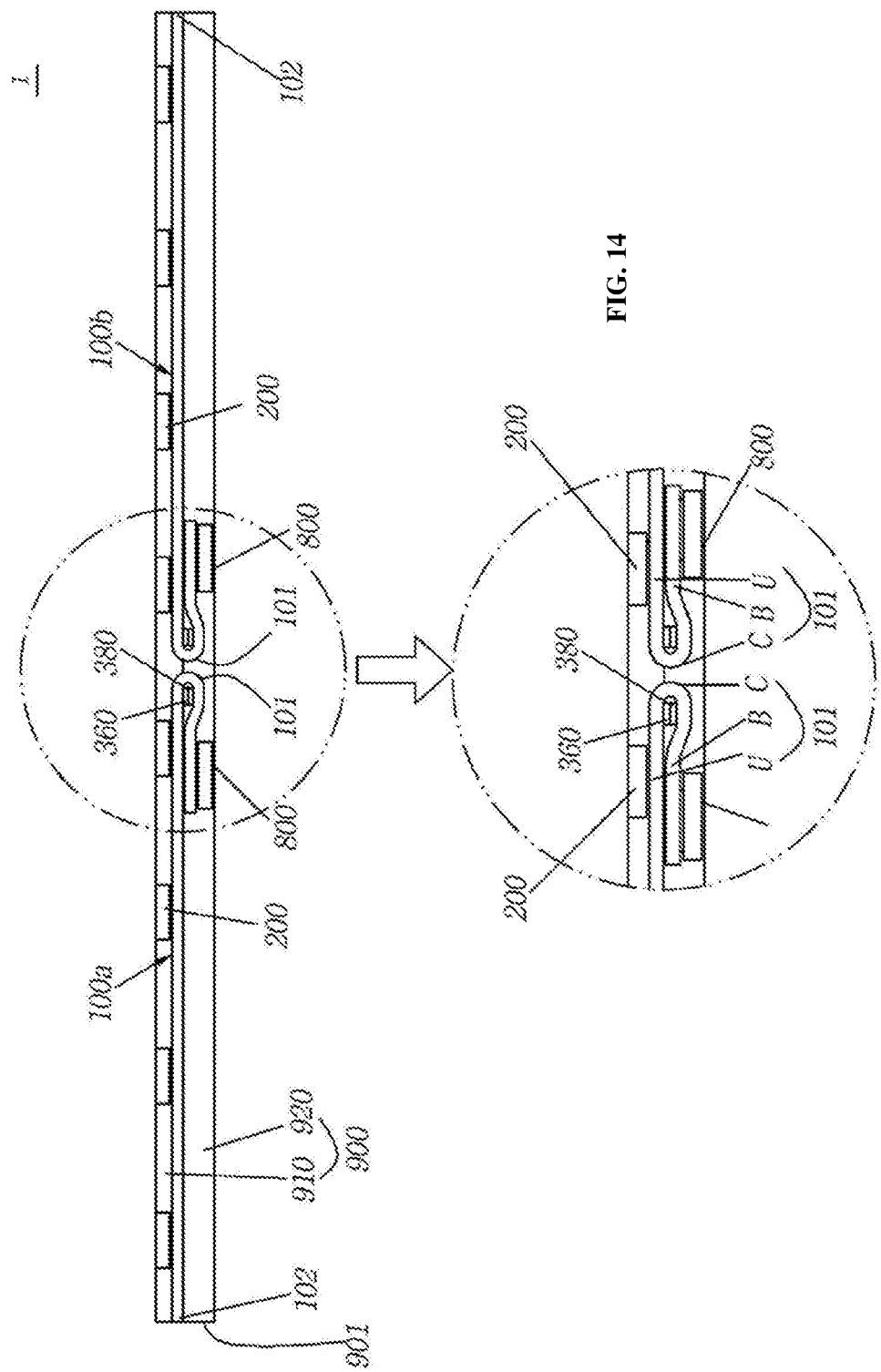
FIG. 14 is a cross-sectional view illustrating an LED display module of the LED display panel according to the 2-1$^{st}$ embodiment of the present invention.
Figure 15:
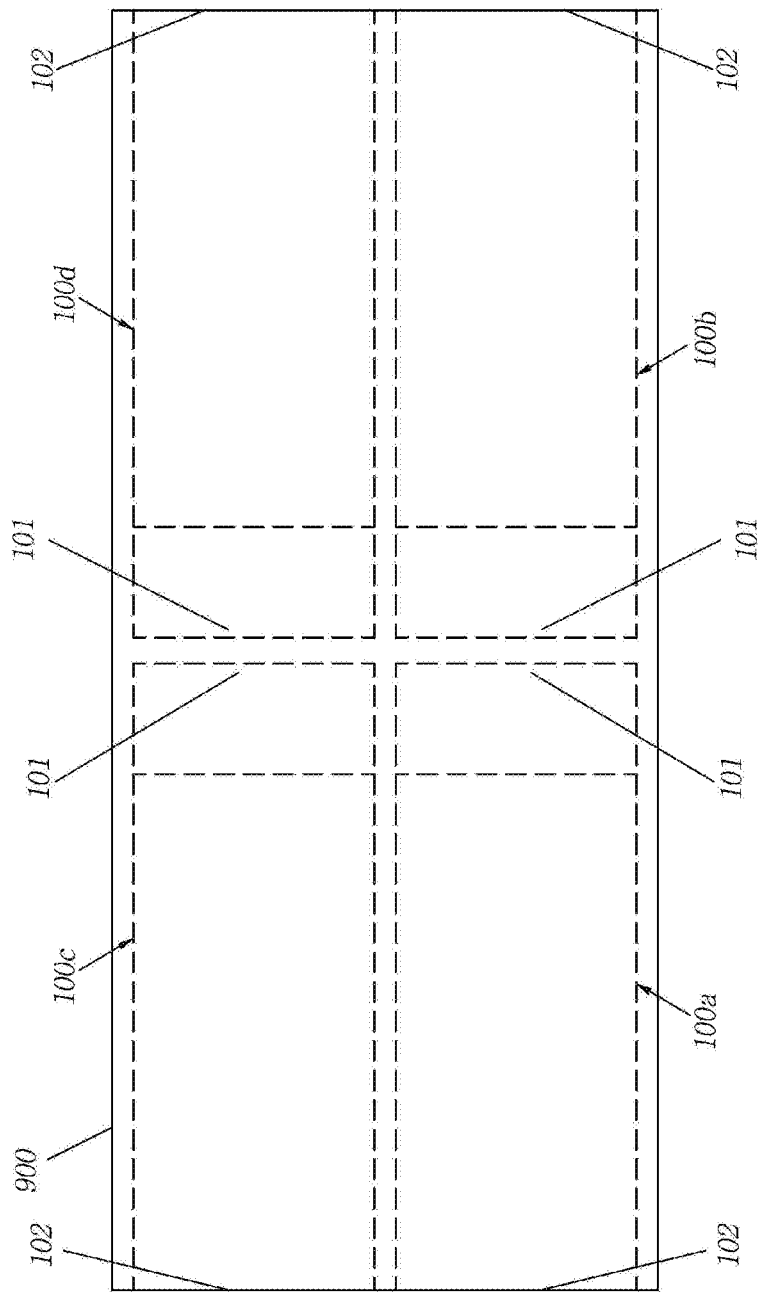
FIG. 15 is a plan view illustrating a state in which LEDs are omitted from an LED display module of the LED display panel according to the 2-1$^{st}$ embodiment of the present invention.

FIG. 12 is a cross-sectional view illustrating an LED display panel according to a 2-1$^{st}$ embodiment of the present invention, FIG. 13 is a partial cross-sectional view illustrating the LED display panel according to the 2-1$^{st}$ embodiment of the present invention, FIG. 14 is a cross-sectional view illustrating an LED display module of the LED display panel according to the 2-1$^{st}$ embodiment of the present invention, and FIG. 15 is a plan view illustrating a state in which LEDs are omitted from an LED display module of the LED display panel according to the 2-1$^{st}$ embodiment of the present invention.

Referring to FIGS. 12 and 13, the LED display panel largely includes inner LED display modules 1a and outer LED display modules 1b. In this embodiment, the structure of the inner LED display modules 1a is the same as that of the outer LED display modules 1b. The outer LED display modules 1b are located at the left and right sides of the array of the LED display modules 1 along the lengthwise direction and the inner LED display modules 1b are located between the outer LED display modules 1b. FIGS. 12 and 13 illustrate only the array of the LED display modules in the lengthwise direction, but arrays of LED display modules in the widthwise direction may also be present. Preferably, the LED display modules are arrayed in a matrix to fabricate a large-area LED display.

In FIGS. 12 and 13, reference numerals 1a and 1b are used to distinguish the inner LED display modules 1a and the outer LED display modules 1b. However, in FIGS. 14 and 15, the inner LED display modules and the outer LED display modules are collectively denoted by reference numeral 1.

Referring to FIGS. 14 and 15, the LED display module 1 includes a first flexible circuit board 100a and a second flexible circuit board 100b arrayed along the lengthwise direction and located in a row and adjacent to each other. The LED display module 1 includes: a third flexible circuit board 100c located in a row and adjacent to the first flexible circuit board 100a along the widthwise direction; and a fourth flexible circuit board 100d located in a row and adjacent to the second flexible circuit board 100b along the widthwise direction and located in a row and adjacent to the third flexible circuit board 100c along the lengthwise direction.

LEDs 200 are arrayed and mounted at a predetermined pitch on the upper surfaces of main areas of the first flexible circuit board 100a, the second flexible circuit board 100b, the third flexible circuit board 100c, and the fourth flexible circuit board 100d. The LEDs 200 may be LED packages including a plurality of LED chips emitting light of different wavelengths. The LED packages may be single or multi-pixel LED packages mounted on the corresponding flexible circuit boards. The LEDs 200 may be LED chips directly mounted on the corresponding flexible circuit boards. The LED chips may be pixel elements emitting light of different wavelengths.

Controller units 800 are placed on the first flexible circuit board 100a, the second flexible circuit board 100b, the third flexible circuit board 100c, and the fourth flexible circuit board 100d to control the LEDs 200. The controller units 800 may include drive ICs or controller boards.

The flexible LED display module 1 includes an overlying upper viscoelastic film 910 and an underlying lower viscoelastic film 920 bonded to each other through the first flexible circuit board 100a, the second flexible circuit board 100b, the third flexible circuit board 100c, and the fourth flexible circuit board 100d therebetween. The upper viscoelastic film 910 and the lower viscoelastic film 920 bonded to each other form a viscoelastic layer 900 covering and protecting the first flexible circuit board 100a, the second flexible circuit board 100b, the third flexible circuit board 100c, and the fourth flexible circuit board 100d. Each of the upper viscoelastic film 910 and the lower viscoelastic film 920 is preferably a film- or sheet-like urethane rubber as a viscoelastic material. The upper viscoelastic film 910 and the lower viscoelastic film 920 may be bonded to each other through the first, second, third, and fourth flexible circuit boards 100a, 100b, 100c, and 100d by hot pressing at high temperature.

Each of the first flexible circuit board 100a, the second flexible circuit board 100b, the third flexible circuit board 100c, and the fourth flexible circuit board 100d includes a folded edge portion 101 and an unfolded edge portion 102 opposite to the folded edge portion 101. In this embodiment, the folded edge portion 101 of the first flexible circuit board 100a is adjacent to the folded edge portion 101 of the second flexible circuit board 100b inside the viscoelastic layer 900. The folded edge portion 101 of the third flexible circuit board 100c is adjacent to the folded edge portion 101 of the fourth flexible circuit board 100d inside the viscoelastic layer 900.

Thus, only the end portions adjacent to the unfolded edge portions 102 are present at both edges of the flexible LED display module 1. Both end portions adjacent to the unfolded edge portions 102 are formed as cut surfaces 901 of the viscoelastic layer 900, that is, the upper viscoelastic film 910 and the lower viscoelastic film 920. If the folded edge portions 101 rather than the unfolded edge portions 102 are adjacent to the cut surfaces, curved portions in which interconnection lines connecting the LEDs 200 to the controller units 800 are present may be damaged or cut during formation of the cut surfaces. Further, it may be difficult to adjust the pitch of the two adjacent edge LEDs on the two adjacent flexible circuit boards to the pitch of the LEDs present on the corresponding flexible circuit board.

The constructions and configurations of the third flexible circuit board 100c and the fourth flexible circuit board 100d are the same as those of the first flexible circuit board 100a and the second flexible circuit board 100b. The third flexible circuit board 100c and the fourth flexible circuit board 100d may be optionally omitted. Thus, a detailed description of the third flexible circuit board 100c and the fourth flexible circuit board 100d is replaced by that of the first flexible circuit board 100a and the second flexible circuit board 100b.

Each of the folded edge portions 101 consists of an upper portion as a first portion U where some of the LEDs 200 arranged on the upper surface of the main area of the first or second flexible circuit board 100a or 100b are located, a bottom portion as a second portion B folded on and facing the lower surface of the first portion U, and a curved portions C permitting folding of the second portion B on the first portion U. The curved portion C has a predetermined radius of curvature. The first portion U is located above relative to the curved portion C and its primary surface is directed upwards. The second portion B is located below relative to the curved portion C and its primary surface is directed downwards. Most of the LEDs 200 are mounted on the upper surfaces of areas devoid of the folded edge portions 101 in the main areas of the first and second flexible circuit boards 100a and 100b. The other LEDs are mounted on the first portions U of the folded edge portions 101 in the main areas of the first and second flexible circuit boards 100a and 100b.

The viscoelastic layer 900 is formed to cover all exposed surfaces of the first and second flexible circuit boards 100a and 100b except for portions of the surfaces of the LEDs 200 and portions of the surfaces of the controller units 800. The viscoelastic layer 900 includes through holes through which portions of the surfaces of the LEDs 200 (i.e. the upper surfaces of the LEDs 200) are exposed. For partial accommodation or exposure of the controller units 800, the lower viscoelastic film 920 includes closed holes or through holes at positions corresponding to the controller units 800.

As mentioned earlier, only one edge of each of the first and second flexible circuit boards 100a and 100b is bent to form the folded edge portion 101 in which the first portion U located above relative to the curved portion C is folded on the second portion B located below relative to the curved portion C. The other edge of each of the first and second flexible circuit boards 100a and 100b remains unbent to form the unfolded edge portion 102 without a curved portion.

When the folded edge portion 101 is formed, a second dummy pad 380 attached to the second portion B is brought into contact with a first dummy pad 360 attached to the bottom surface of the first portion U so as to face the first dummy pad 360. Thus, the dummy pads limit the curvature and the radius of curvature of the curved portion C of the folded edge portion 101. In other words, when one edge of each of the first and second flexible circuit boards 100a and 100b is bent to form the folded edge portion 101 including the curved portion C, the first portion U located above relative to the curved portion C, and the second portion B located below relative to the curved portion C and folded on the lower surface of the first portion U, the (inner or outer) curvature and the (inner or outer) radius of curvature of the curved portion C are limited by the first dummy pad 360 and the second dummy pad 380. By the limited curvature and radius of curvature, circuits of the flexible circuit board 100a or 100b is protected from damage caused by bending. The viscoelastic layer 900 is formed so as to cover the folded edge portion 101 and the unfolded edge portion 102 of each of the flexible circuit boards 100a and 100b (hereinafter collectively denoted by reference numeral "100") and all areas between the folded edge portion 101 and the unfolded edge portion 102. The viscoelastic layer 900 also covers the bottom surface of the flexible circuit board 100 except for the areas covered with the edge portions formed by bending the flexible circuit board 100, as well as the upper surface of the flexible circuit board 100.

In this embodiment, the viscoelastic layer 900 may be formed by bonding an upper viscoelastic film 910 to a lower viscoelastic film 920. Each of the upper viscoelastic film 910 and the lower viscoelastic film 920 is preferably a film- or sheet-like urethane rubber. The viscoelastic layer 900 may be formed by arranging the flexible circuit board 100 between the upper viscoelastic film 910 and the lower viscoelastic film 920 and pressing the upper viscoelastic film 910 and the lower viscoelastic film against each other at high temperature ("hot pressing").

The upper viscoelastic film 910 includes through holes into which the LEDs 200 are fitted and through which the LEDs 200 are exposed. It is preferred that the upper surface of the upper viscoelastic film 910 lies at the same level as the upper surfaces of the LEDs 200, but it is noted that the height of the through holes of the upper viscoelastic film 910 may be lower than the upper surfaces of the LEDs 200. The lower viscoelastic film 920 may include closed holes or through holes formed at positions corresponding to the controller units 800 and into which the controller units 800 are fitted. When closed holes are formed, the controller units 800 are covered with the lower viscoelastic film 920 and are thus not exposed to the outside.

The edges of the viscoelastic layer 900 are cut along vertical cutting lines passing through the upper viscoelastic film 910 and the lower viscoelastic film 920. Heat generated by a cutting tool during cutting leads to the disappearance of the boundaries between the upper viscoelastic film 910 and the lower viscoelastic film 920 at the lateral ends of the upper viscoelastic film 910 and the lower viscoelastic film 920.

Referring again to FIGS. 12 and 13, the first flexible circuit board 100a and the second flexible circuit board 100b in each of the inner LED display modules 1a and the outer LED display modules 1b have the same structure in the viscoelastic layer 900; the folded edge portion 101 of the first flexible circuit board 100a and the folded edge portion 101 of the second flexible circuit board 100b are oriented inwards and face each other; and the unfolded edge portion 102 of the first flexible circuit board 100a and the unfolded edge portion 102 of the second flexible circuit board 100b are located at the edges of the LED display module 1a or 1b and are directed outwards.

Due to this structure, the unfolded edge portion 102 of the first or second flexible circuit board 100a or 100b of one inner LED display module 1a is oriented to face the unfolded edge portion 102 of the first or second flexible circuit board 100a or 100b of the other adjacent inner LED display module 1a. When the viscoelastic layer is cut to form a cut surface 901, a portion of the unfolded edge portion 102 of the first or second flexible circuit board 100a or 100b may also be removed by the cutting, facilitating adjustment of the distance between the cut surface 901 and the center of the adjacent LED 200 to half the pitch of the LEDs. This ensures adjustment of the distance between the centers of the two adjacent edge LEDs 200 of the two adjacent inner LED display modules 100a to the pitch of the LEDs in the corresponding LED display module.

In this embodiment, the construction of the inner LED display module 1a is the same as that of the outer LED display module 1b. Accordingly, the unfolded edge portion 102 of the first or second flexible circuit board 100a or 100b of the inner LED display module 1a faces the unfolded edge portion 102 of the second or first flexible circuit board 100b or 100a of the adjacent outer LED display module 1b. Thus, the distance between the two adjacent edge LEDs 200 of the inner LED display module 1a and the adjacent outer LED display module 1b can be easily adjusted to the pitch of the LEDs in the corresponding LED display module.

In this embodiment, the unfolded edge portions 102 of the first and second flexible circuit boards 100a and 100b are located at both edges of the outer LED display module 1b. This is advantageous in adjusting the pitch and can greatly contribute to the reduction of areas devoid of LEDs at the edges of the display panel.

FIGS. 16 to 19 illustrate a method for constructing a flexible LED display module.

Figure 16:
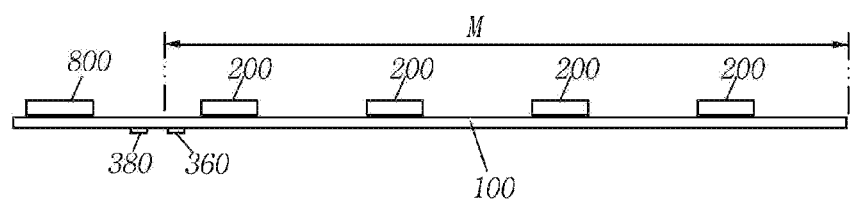
FIGS. 16 to 19 illustrate a method for constructing a flexible LED display module of the LED display panel according to the 2-1$^{st}$ embodiment of the present invention.

Referring first to FIG. 16, LEDs 200 are arrayed and mounted at a predetermined pitch on the upper surface of a portion (i.e. a main portion M) other than one edge of a flexible circuit board 100, and a controller unit 800 is mounted on the upper surface of the edge of the flexible circuit board 100. The controller unit 800 may include a drive IC and/or a controller board.

The flexible circuit board 100 may include the laminate structure illustrated in FIG. 5. A second dummy pad 380 is attached to the bottom surface of the edge portion of the flexible circuit board 100 and a first dummy pad 360 is attached to the bottom surface of the main portion M of the flexible circuit board 100.

Figure 17:
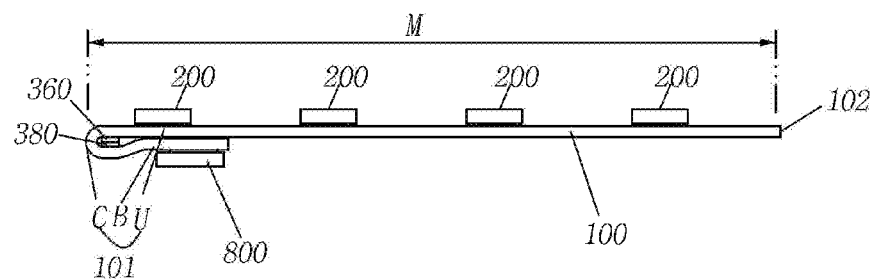

Referring next to FIG. 17, the flexible circuit board 100 is bent such that the upper surface of the edge portion is directed downwards while the main portion of the flexible circuit board 100 remains intact. The bending of the flexible circuit board 100 at one side of the flexible circuit board 100 leads to the formation of a folded edge portion 101. The folded edge portion 101 consists of a curved portion C, a first portion U located above relative to the curved portion C and mounted with one or more of the LEDs, and a second portion B located below relative to the curved portion C and mounted with the controller unit 800. Here, the inner and outer radii of curvature (particularly, the outer radius of curvature) of the curved portion C are limited by the first dummy pad 360 and the second dummy pad 380. Here, it is preferable that neither an upper metal pattern layer formed by plating and bonded to the LEDs 200 and the controller unit 800 nor a lower metal pattern layer is present in the curved portion C. An unfolded edge portion 102 is formed at the other unbent edge of the flexible circuit board 100.

In this manner, a plurality of flexible circuit boards 100 are prepared.

Figure 18:
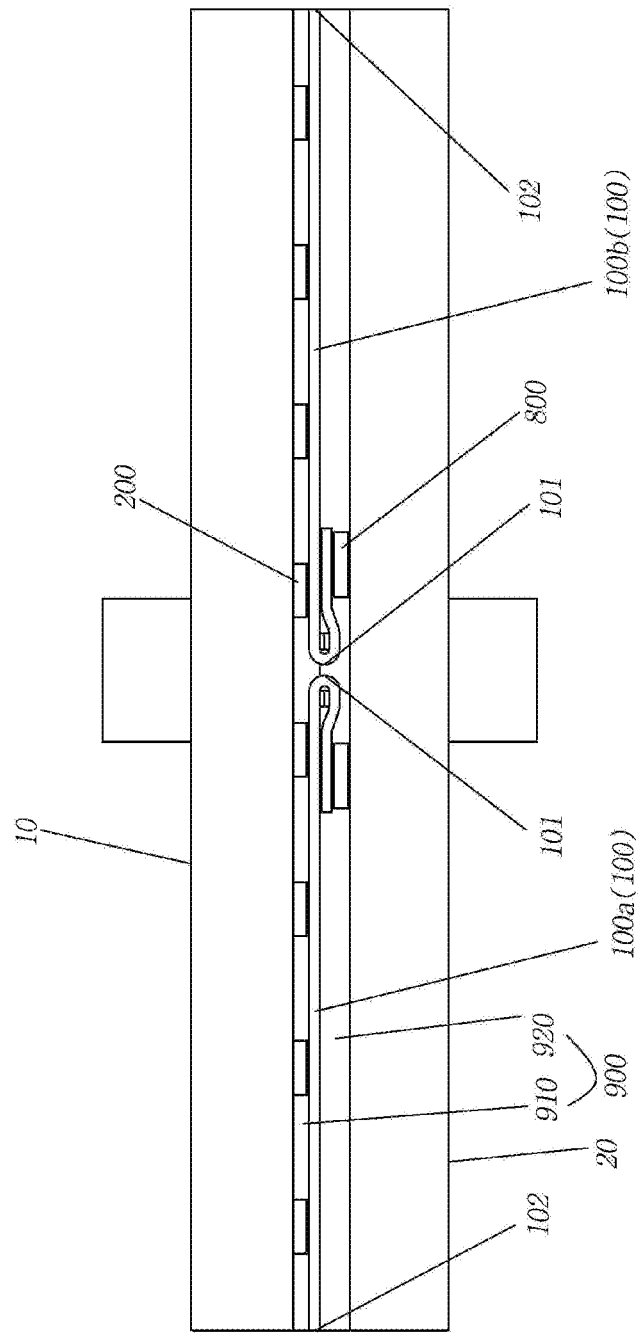

Referring next to FIG. 18, two of the flexible circuit boards 100, that is, a first flexible circuit board 100a and a second flexible circuit board 100b, are arranged in a row in the lengthwise direction such that the folded edge portions 101 face each other between an upper viscoelastic film 910 and a lower viscoelastic film 920. Here, the distance between the centers of the two adjacent LEDs 200 in the folded edge portions 101 of the first and second flexible circuit boards 100a and 100b is adjusted to the pitch of the LEDs arrayed on the corresponding flexible circuit board 100a or 100b. A third flexible circuit board and a fourth flexible circuit board may be further arranged adjacent to the first flexible circuit board and the second flexible circuit board in the widthwise direction, as described above. The several flexible circuit boards can be integrated with one viscoelastic layer to construct a large-area flexible LED display module.

The upper viscoelastic film 910 includes through holes corresponding to the LEDs 200 and is arranged such that the LEDs 200 are inserted into the corresponding through holes. The lower viscoelastic film 920 may include through holes or closed holes corresponding to the controller units 800. The lower viscoelastic film 920 is arranged such that the controller units 800 are inserted into the corresponding through holes or closed holes. The lower viscoelastic film 920 and the upper viscoelastic film 910 are pressed against the flexible circuit board 100 by hot pressing using an upper mold 10 and a lower mold 20 to form a viscoelastic layer 900 consisting of the lower viscoelastic film 920 and the upper viscoelastic film 910.

Figure 19:
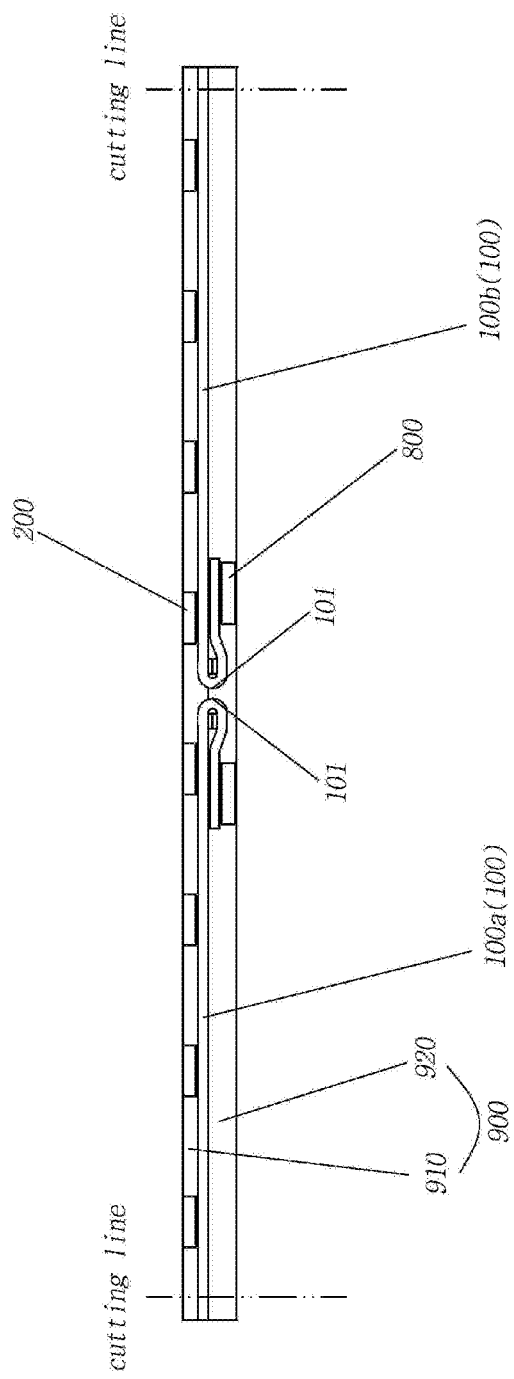

Referring next to FIG. 19, both side edges of the viscoelastic layer 900 are cut. Heat generated during cutting allows the formation of cut surfaces where the edges of the upper viscoelastic film 910 and the lower viscoelastic film 920 are connected to each other without any boundary. The distance between each of the cut surfaces and the center of the adjacent LED 200 is adjusted to half the pitch of the LEDs. A portion of the unfolded edge portion of the first or second flexible circuit board may also be removed by the cutting.

Figure 20:
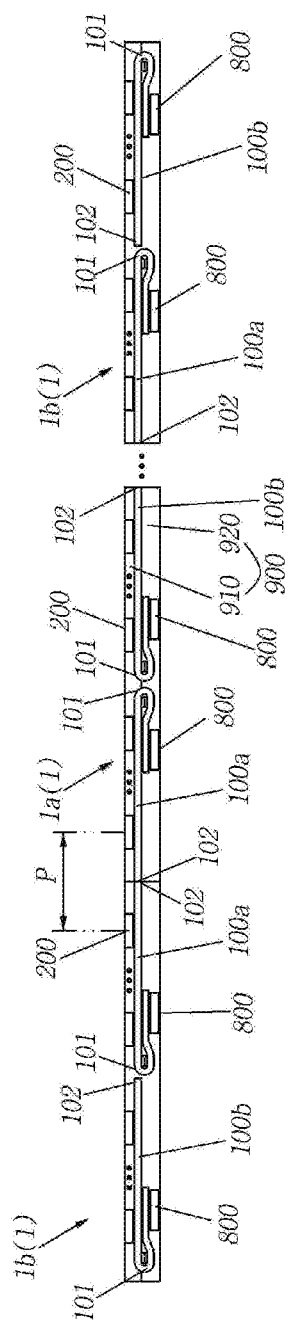
FIGS. 20 and 21 illustrate an LED display panel according to a 2-2$^{nd}$ embodiment of the present invention and a flexible LED display module of the LED display panel, respectively.
Figure 21:
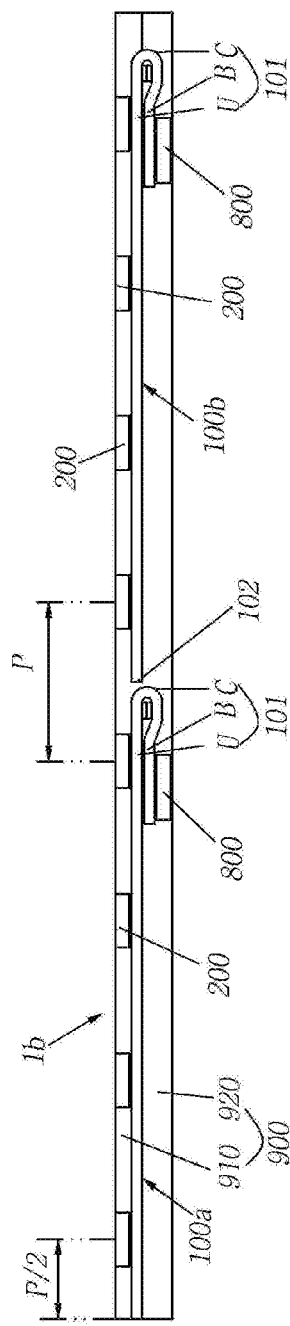
Figure 22:
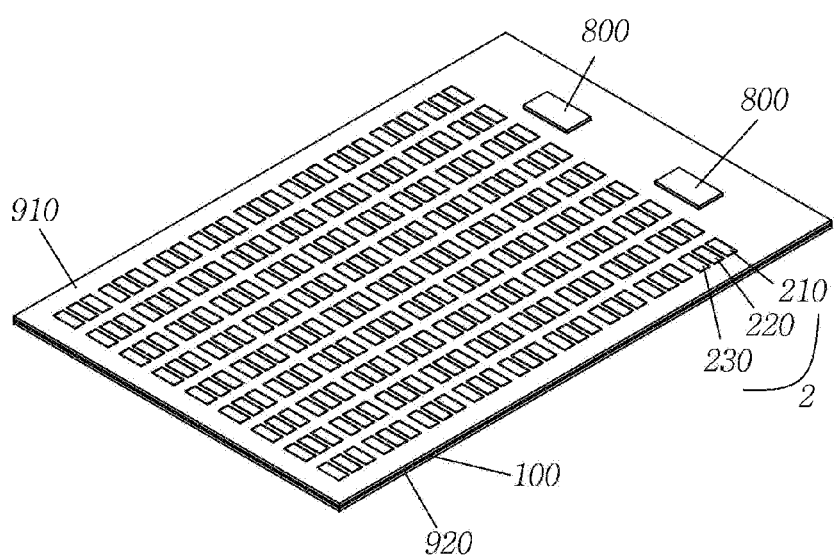
FIG. 22 is a perspective view illustrating a flexible LED display module according to a 3-1$^{st}$ embodiment of the present invention.
Figure 23:
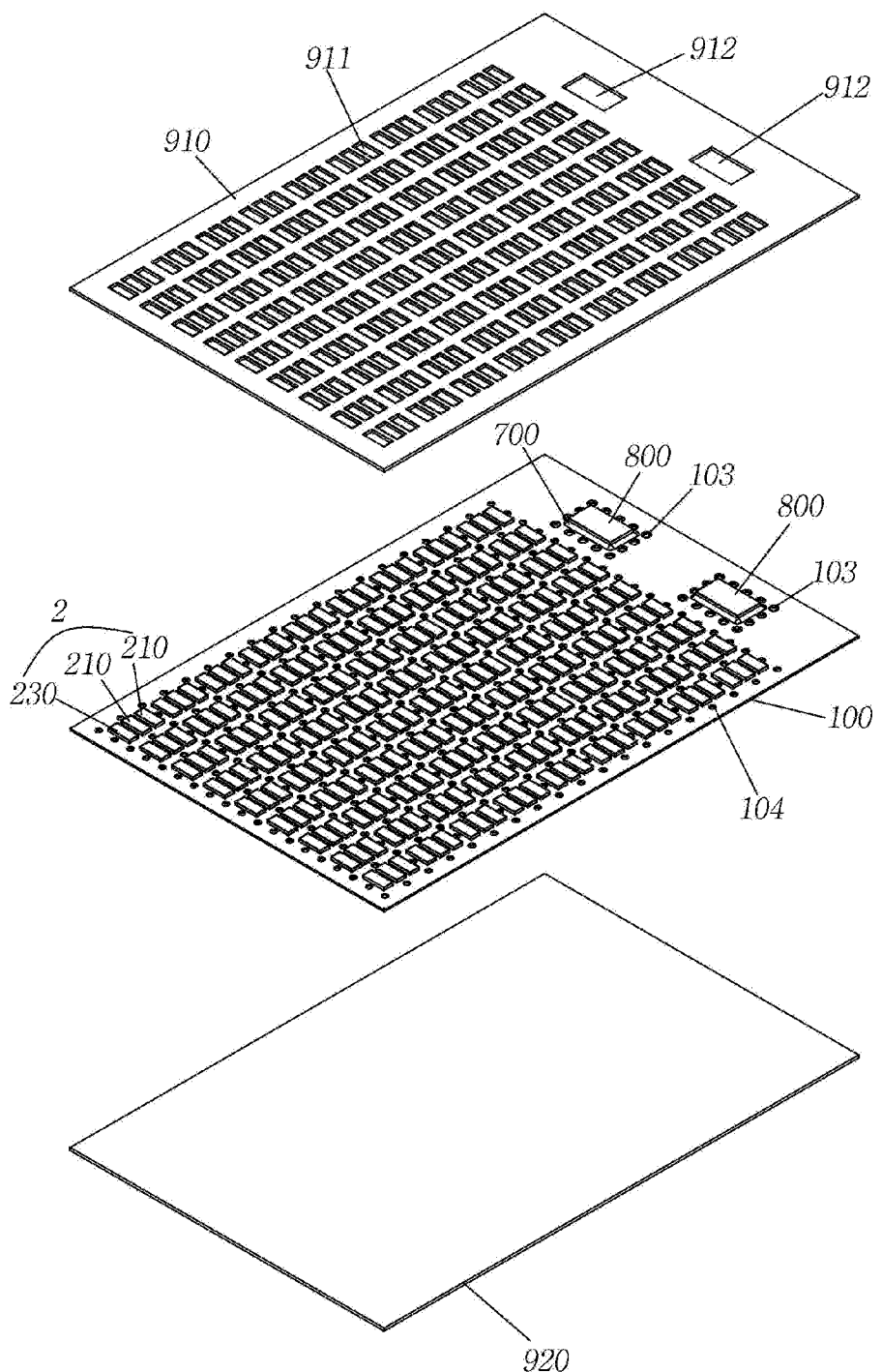
FIG. 23 is an exploded perspective view illustrating the flexible LED display module according to the 3-1$^{st}$ embodiment of the present invention.
Figure 24:
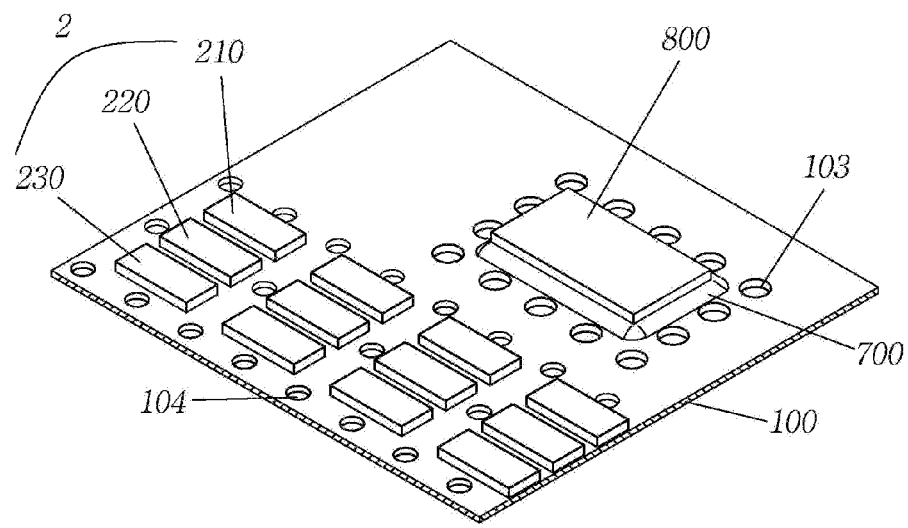
FIG. 24 is a partially enlarged perspective view illustrating a flexible circuit board on which LED pixels are arrayed in the flexible LED display module according to the 3-1$^{st}$ embodiment of the present invention.

FIG. 20 illustrate an LED display panel according to a 2-2$^{nd}$ embodiment of the present invention and FIG. 21 is a cross-sectional view illustrating a flexible LED display module used in the LED display panel of FIG. 20.

Referring to FIGS. 20 and 21, the LED display panel includes inner LED display modules 1a and outer LED display modules 1b. The plurality of inner LED display modules 1a are arranged between the two outer LED display modules 1b. According to this embodiment, each of the inner LED display modules 1a includes a structure in which two flexible circuit boards are arranged in a row and adjacent to each other in the lengthwise direction in a viscoelastic layer 900 and folded edge portions of the flexible circuit boards are adjacent to and face each other. This structure is the same as that of the inner LED display module 1a described in the previous embodiment.

According to the previous embodiment, the outer LED display module 1b has the same structure as the inner LED display module 1a. In contrast, the outer LED display module 1b used in this embodiment has a different structure from the outer LED display module used in the previous embodiment. In the outer LED display module 1b used in this embodiment, a folded edge portion 101 of a first flexible circuit board 100a and an unfolded edge portion 102 of a second flexible circuit board 100b are adjacent to and face each other. An unfolded edge portion 102 of the first flexible circuit board 100a is oriented toward the adjacent inner LED display module 1a and a folded edge portion 101 of the second flexible circuit board 100b is arranged at one edge of the LED display panel. The unfolded edge portion 102 of the first flexible circuit board of the outer LED display module 1b is oriented in a direction facing an unfolded edge portion 102 of the flexible circuit board of the inner LED display module 1a. Accordingly, it is easy to adjust the distance between the centers of two adjacent edge LEDs 200 of the two adjacent outer and inner LED display modules 1b and 1a to the pitch P of all LEDs 200, as in the previous embodiment.

Third Embodiments

[3-1$^{st}$ Embodiment]

Referring to FIGS. 22 to 27, a flexible LED display module according to a 3-1$^{st}$ embodiment of the present invention includes a flexible circuit board 100 having an upper surface and a lower surface, a plurality of LED pixels 2 arrayed in a matrix on the flexible circuit board 100, and drive ICs 800 arranged on the upper surface of the flexible circuit board 100 to participate in controlling the LED pixels 2. The flexible LED display module further include an upper viscoelastic film 910 and a lower viscoelastic film 920. The flexible circuit board 100 is sandwiched between the upper viscoelastic film 910 and the lower viscoelastic film 920.

The flexible circuit board 100 is prepared by forming conductive circuit patterns on and under an electrically non-conductive substrate base. The upper viscoelastic film 910 and the lower viscoelastic film 920 cover the upper and lower surfaces of the flexible circuit board 100 in a sandwich configuration to protect the conductive circuit patterns formed on and under the substrate base.

Each of the LED pixels 2 may consist of a first LED chip 210 emitting red light, a second LED chip 220 emitting green light, and a third LED chip 230 emitting blue light. In this embodiment, the first LED chips 210, the second LED chips 220, and the third LED chips 230 are directly mounted on the upper surface of the flexible circuit board 100. The distance between the two adjacent LED chips in each pixel is smaller than the distance between the two adjacent edge LED chips of the two adjacent pixels ("inter-pixel distance").

In this embodiment, the upper surface of the flexible circuit board 100 is divided into a main area where the LED pixels 2 are arrayed in a matrix and an edge area where the drive ICs 800 are mounted.

The flexible circuit board 100 includes a plurality of first through holes 103 formed in the edge area to surround the drive ICs 800 and a plurality of second through holes 104 formed in the main area to surround the LED pixels 2.

The first through holes 103 are arrayed in a substantially quadrangular form around each of the drive ICs 800. When the flexible circuit board 100 is bent or curved, the first through holes 103 serve to block and absorb force or stress applied to the drive ICs 800. In other words, when the flexible circuit board 100 is bent, the first through holes 103 prevent direct transmission of damage caused by the bending to the drive ICs 800 and bonding portions connecting the drive ICs 800 to the flexible circuit board 100, with the result that the flexible circuit board 100 is protected from damage and the drive ICs 800 are prevented from being detached from the flexible circuit board 100.

The flexible LED display module has a structure in which the LED pixels 2 are arrayed on the flexible circuit board 100 mounted with the drive ICs 800 and the flexible circuit board 100 are interposed between the upper viscoelastic film 910 and the lower viscoelastic film 920. As described in detail below, portions of the upper viscoelastic film 910 and portions of the lower viscoelastic film 920 may be filled in the first through holes 103. Accordingly, the first through holes 103 serve to block and absorb force generated by flexural or bending deformation of the flexible circuit board 100 and increase the adhesive strength of the upper viscoelastic film 910 and the lower viscoelastic film 920 to the flexible circuit board 100.

The second through holes 104 are arrayed in a substantially quadrangular form around each of the LED pixels 2. When the flexible circuit board 100 is bent or curved, the second through holes 104 serve to block and absorb force or stress applied to the LED pixels 2. In other words, when the flexible circuit board 100 is bent, the second through holes 104 prevent direct transmission of damage caused by the bending to bonding portions (solder joints) connecting the constituent LED chips 210, 220, and 230 of the LED pixels 2 to the flexible circuit board 100, with the result that the flexible circuit board 100 is protected from damage and the LED chips 210, 220, and 230 are prevented from being detached from the flexible circuit board 100. In the drawings, none of the second through holes 104 are formed between the adjacent LED chips in the pixels 2. However, it is noted that the second through holes 104 may be formed between the adjacent LED chips in the pixels 2.

As described in detail below, portions of the upper viscoelastic film 910 and portions of the lower viscoelastic film 920 may be filled in the second through holes 104. Accordingly, the second through holes 104 serve to block and absorb force generated by flexural or bending deformation of the flexible circuit board 100 and increase the adhesive strength of the upper viscoelastic film 910 and the lower viscoelastic film 920 to the flexible circuit board 100.

Figure 25:
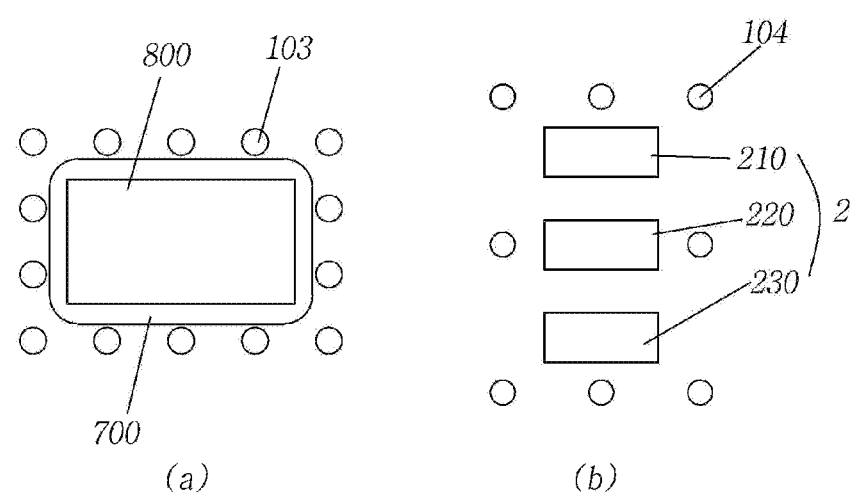
FIG. 25 illustrates plan views of the vicinities of the drive IC (a) and the LED pixel (b) of illustrated in FIG. 24.

In FIG. 25, (a) illustrates an array pattern of the first through holes 103 formed in the flexible circuit board 100 to surround the drive IC 800 and (b) illustrates an array pattern of the second through holes 104 formed in the flexible circuit board 100 to surround the LED pixel 2. The number and array pattern of the first through holes 103 and the number and array pattern of the second through holes 104 may vary. The first through holes 103 and the second through holes 104 are preferably circular or elliptical (most preferably circular) in cross section rather than sharp-edged polygonal, which is susceptible to breakage.

Figure 26:
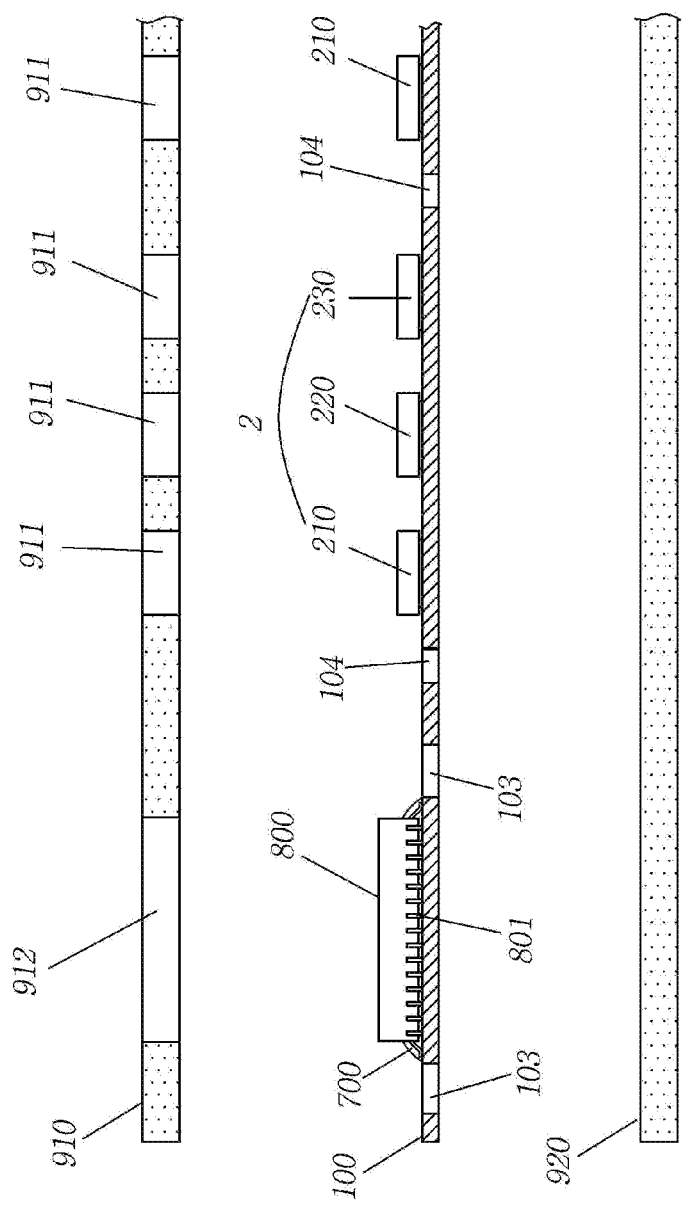
FIG. 26 is an exploded perspective view illustrating the flexible LED display module according to the 3-1$^{st}$ embodiment of the present invention.
Figure 27:
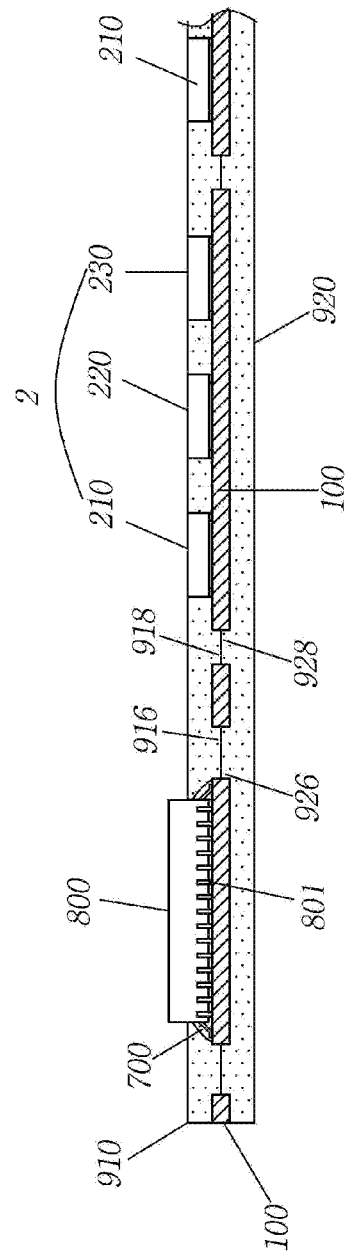
FIG. 27 is a cross-sectional view illustrating the flexible LED display module according to the 3-1$^{st}$ embodiment of the present invention.

As well illustrated in FIGS. 26 and 27, the first LED chips 210, the second LED chips 220, and the third LED chips 230 constituting the LED pixels 2 and the drive ICs 800 controlling the driving of the first LED chips 210, the second LED chips 220, and the third LED chips 230 are mounted on the upper surface of the flexible circuit board 100. The first through holes 103 are formed in the flexible circuit board 100 to surround the drive ICs 800. The second through holes 104 are formed in the flexible circuit board 100 to surround the LED pixels 2. The upper viscoelastic film 910 is formed in contact with the upper surface of the flexible circuit board 100. The LED pixels 2 are exposed through the upper viscoelastic film 910. The upper viscoelastic film 910 includes: first through holes 911 formed corresponding to the first LED chips 210, the second LED chips 220, and the third LED chips 230 constituting the pixels 2 and into which the first LED chips 210, the second LED chips 220, and the third LED chips 230 are fitted; and second holes 912 formed corresponding to the drive ICs 800 and into which the drive ICs 800 are fitted. The lower viscoelastic film 920 is formed in contact with the lower surface of the flexible circuit board 100. The flexible circuit board 100 is sandwiched between the lower viscoelastic film 920 and the upper viscoelastic film 910.

Each of the upper viscoelastic film 910 and the lower viscoelastic film 920 is preferably a film- or sheet-like urethane rubber. The upper viscoelastic film 910 and the lower viscoelastic film 920 are bonded to each other through the flexible circuit board 100 by hot pressing at high temperature. During the bonding, portions of the upper viscoelastic film 910 and portions of the lower viscoelastic film 920 are filled in the first through holes 103 to form first upper filling portions 916 and first lower filling portions 926 within the first through holes 103, respectively; and portions of the upper viscoelastic film 910 and portions of the lower viscoelastic film 920 are filled in the second through holes 104 to form second upper filling portions 918 and second lower filling portions 928 within the second through holes 104, respectively.

As illustrated in FIGS. 23 to 27, the flexible LED display module further includes protective members 700 wholly covering lead terminals 801 of the drive ICs 800 and made of a viscoelastic resin, most preferably a silicone resin. Each of the protective members 700 is formed by applying the resin along the outer circumference of the corresponding drive IC 800 with a dispenser (not illustrated). The protective members 700 serve to reduce damage applied to the circumferences of the drive ICs 800 when the flexible circuit board 100 is curved or bent. Accordingly, the protective members 700 together with the first through holes 103 prevent the lead terminals 801 of the drive ICs 800 from being detached from the flexible circuit board 100 or protect the flexible circuit board 100 from damage around the drive ICs 800.

[3-2$^{Nd}$ Embodiment]

Figure 28:
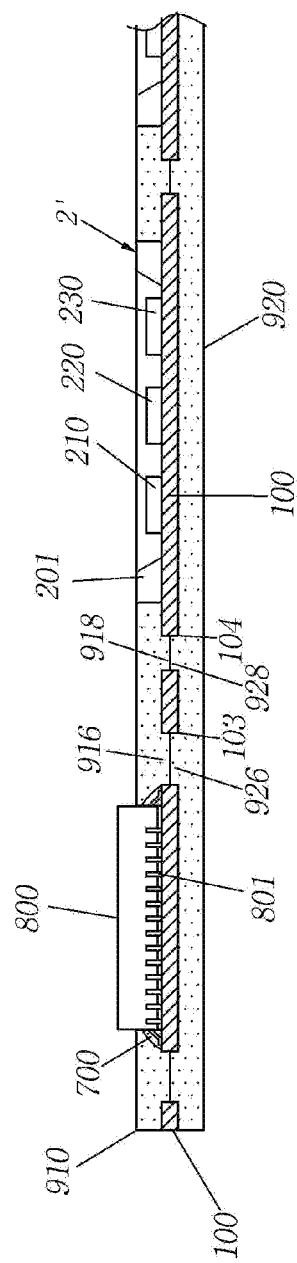
FIG. 28 is a cross-sectional view illustrating a flexible LED display module according to a 3-2$^{nd}$ embodiment of the present invention.

FIG. 28 is a cross-sectional view illustrating a flexible LED display module according to a 3-2$^{nd}$ embodiment of the present invention.

The flexible LED display module according to the 3-1$^{st}$ embodiment has a structure in which first LED chips, second LED chips, and third LED chips constituting LED pixels are directly mounted on a flexible circuit board.

In contrast, the flexible LED display module according to the 3-2$^{nd}$ embodiment includes a structure in which package-type LED pixels 2', each including a first LED chip 210, a second LED chip 220, a third LED chip 230, and a reflector or housing 201 accommodating the LED chips, are mounted on the upper surface of a flexible circuit board 100, as well illustrated in FIG. 28. Here, an upper viscoelastic film 910 includes first holes corresponding to the LED pixels 2' and second holes corresponding to drive ICs 800. Each of the reflectors or housings 201 has a cavity filled with an encapsulant to protect the first LED chip 210, the second LED chip 220, and the third LED chip 230. Each of the package-type LED pixels 2' may be of a CSP type, as illustrated. Alternatively, each of the package-type LED pixels 2' may be of a lead frame package type.

As in the 3-1$^{st}$ embodiment, the upper viscoelastic film 910 is bonded to a lower viscoelastic film 920 through the flexible circuit board 100 by hot pressing at high temperature. During the bonding, portions of the upper viscoelastic film 910 and portions of the lower viscoelastic film 920 are filled in first through holes 103 formed around the drive ICs 800 to form first upper filling portions 916 and first lower filling portions 926, respectively, and portions of the upper viscoelastic film 910 and portions of the lower viscoelastic film 920 are filled in second through holes 104 formed around the LED pixels 2' to form second upper filling portions 918 and second lower filling portions 928, respectively.

Other constructions are the same as those in the 3-1$^{st}$ embodiment.

[3-3$^{rd}$ Embodiment]

Figure 29:
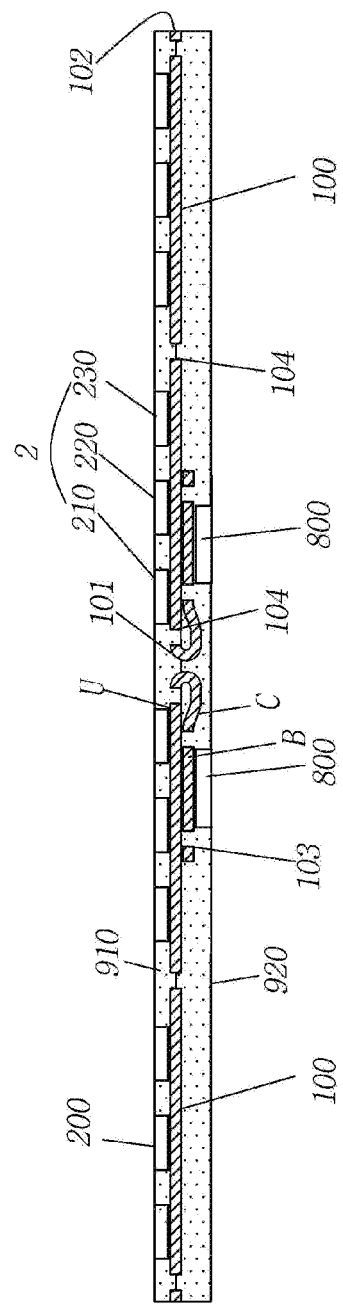
FIG. 29 is a cross-sectional view illustrating a flexible LED display module according to a 3-3$^{rd}$ embodiment of the present invention.

FIG. 29 is a cross-sectional view illustrating a flexible LED display module according to a 3-3$^{rd}$ embodiment of the present invention.

Each of the flexible LED display modules according to the 3-1$^{st}$ and 3-2$^{nd}$ embodiments includes one flexible circuit board.

Referring to FIG. 29, the flexible LED display module according to the 3-3$^{rd}$ embodiment of the present invention includes first and second flexible circuit boards 100 arrayed in the lengthwise direction. One end of the first flexible circuit board 100 is adjacent to one end of the second flexible circuit board 100.

In this embodiment, first, second, and third LED chips 210, 220, and 230 as LED light sources are directly mounted on the first and second flexible circuit boards 100, as in the 3-1$^{st}$ embodiment. Alternatively, package-type LED pixels, each including a first LED chip, a second LED chip, a third LED chip, and a housing accommodating the LED chips, may be directly mounted on the first and second flexible circuit boards 100, as in the 3-2$^{nd}$ embodiment.

As in the foregoing embodiments, drive ICs 800 are placed on the flexible circuit board 100 to control the LED pixels or the LED chips. Each of the first and second flexible circuit boards 100 includes a folded edge portion 101 and an unfolded edge portion 102 opposite to the folded edge portion 101. In this embodiment, the folded edge portion 101 of the first flexible circuit board 100 is adjacent to and faces the folded edge portion 101 of the adjacent second flexible circuit board 100. Thus, the unfolded edge portions 102 are located at both edges of the flexible LED display module.

As described previously, an upper viscoelastic film 910 is bonded to a lower viscoelastic film 920 by hot pressing. After construction of the flexible LED display module, the edges of the viscoelastic films of the flexible LED display module are removed by cutting. Due to the presence of the unfolded edge portion 102 at both edges of the flexible LED display module, no damage to circuits occurs, avoiding the formation of defects by cutting. If the folded edge portions 101 rather than the unfolded edge portions 102 are present at the cut surfaces, curved portions in which interconnection lines connect the LED chips to drive ICs 800 may be damaged or cut when the cut surfaces are formed. Further, it may be difficult to adjust the pitch of the two adjacent edge LEDs of the adjacent flexible circuit boards 100 to the pitch of the LEDs present on the corresponding flexible circuit board.

Each of the folded edge portions 101 consists of an upper portion U where one of the LED chips is located, a bottom portion B folded on and facing the lower surface of the upper portion, and a curved portions C permitting folding of the bottom portion on the upper portion. The curved portion C has a predetermined radius of curvature.

A drive IC 800 is mounted on the bottom portion of the folded edge portion 101 of each of the first and second flexible circuit boards 100. The first and second flexible circuit boards 100 include first through holes 103 formed in the bottom portions B of the folded edge portions 101 to surround the drive ICs 800. The first, second, and third LED chips 210, 220, and 230 constituting the LED pixels 2 are mounted on the upper surfaces of the first and second flexible circuit boards 100. Second through holes 104 are formed in the first and second flexible circuit boards 100 to surround the LED pixels 2. Portions of the upper viscoelastic film 910 and/or portions of the lower viscoelastic film 920 are filled in the first through holes 103 and the second through holes 104. For example, portions of the upper viscoelastic film 910 and portions of the lower viscoelastic film 920 may be filled in the second through holes 104 to form upper filling portions and lower filling portions, respectively, and only portions of the lower viscoelastic film 920 may be filled in the first through holes 103 to form lower filling portions.

3-4$^{th}$ Embodiment

Figure 30:
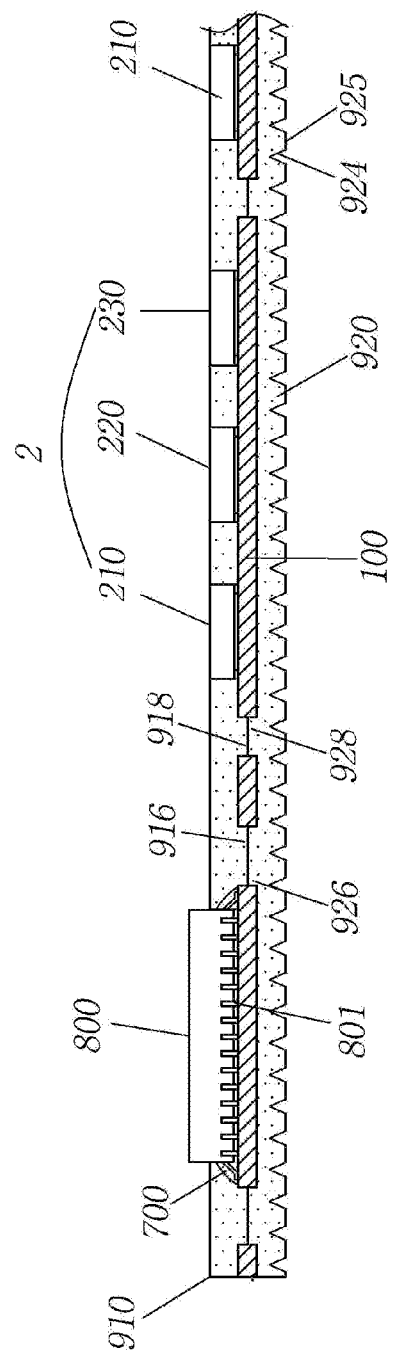
FIG. 30 is a cross-sectional view illustrating a flexible LED display module according to a 3-4$^{th}$ embodiment of the present invention.
Figure 31:
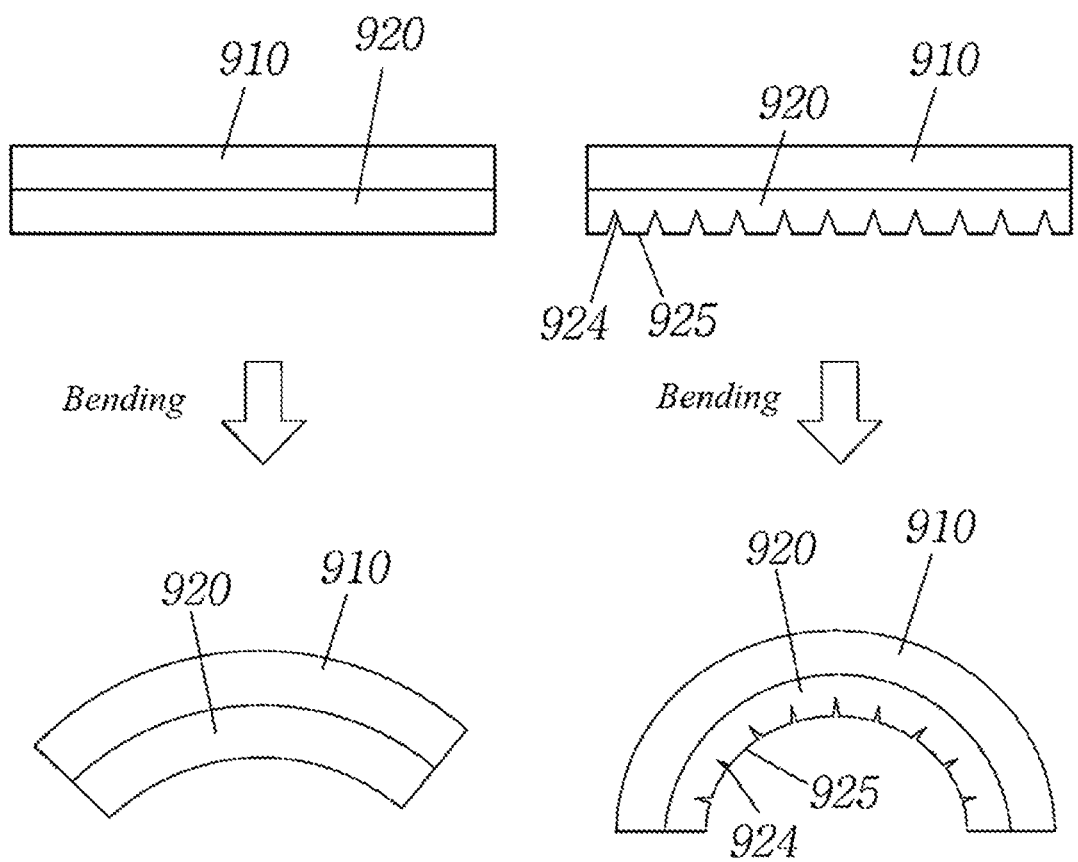
FIG. 31 illustrates the flexural properties of the flexible LED display module according to the 3-4$^{th}$ embodiment of the present invention.
Figure 32:
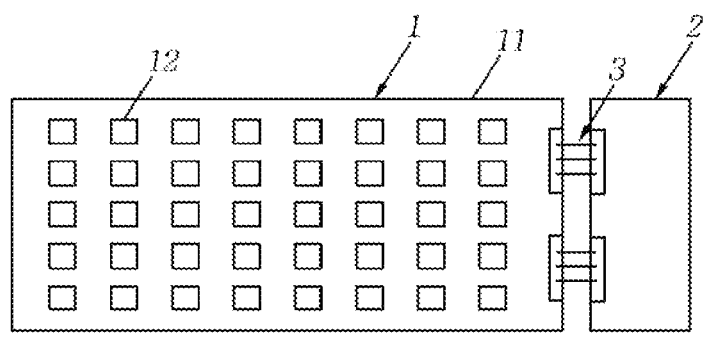
FIGS. 32 and 33 illustrate exemplary flexible LED displays known in the art.
Figure 33:
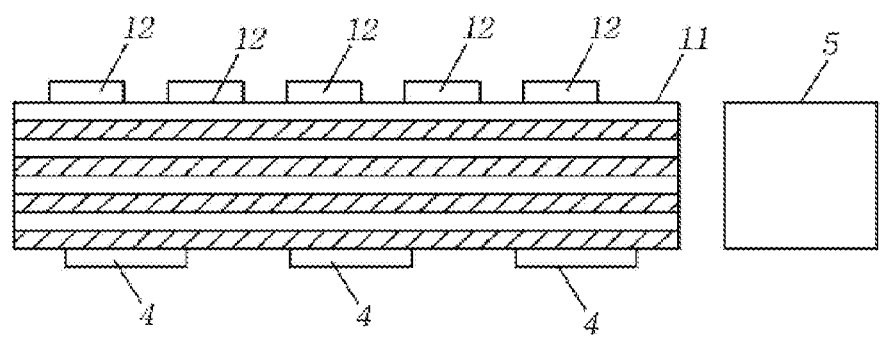

FIG. 30 is a cross-sectional view illustrating a flexible LED display module according to a 3-4$^{th}$ embodiment of the present invention and FIG. 31 illustrates the flexural properties of the flexible LED display module according to the 3-4$^{th}$ embodiment of the present invention.

As illustrated in FIG. 30, the flexible LED display module includes a flexible circuit board 100, a plurality of LED pixels 2 arrayed in a matrix on the upper surface of the flexible circuit board 100, drive ICs 800 arranged on the upper surface of the flexible circuit board 100 to participate in controlling the LED pixels 2, and an upper viscoelastic film 910 and a lower viscoelastic film 920 bonded to each other through the flexible circuit board 100, as in the 3-1$^{st}$ embodiment.

According to this embodiment, the lower viscoelastic film 920 includes an irregular pattern on the lower surface thereof. The irregular pattern consists of concave portions 924 and convex portions 925 formed alternately. The irregular pattern is provided to overcome the limited curvature of conventional flexible LED display modules. The irregular pattern is applied to the lengthwise direction as well as the widthwise direction shown in FIGS. 30 and 31. In this case, the formation of the irregular pattern overcomes limited curvature in all directions. That is to say, the concave portions 924 completely surround the convex portions 925, achieving improved flexural properties in all directions.

The irregular pattern is preferably formed by a surface pattern of a lower mold pressing the lower viscoelastic film 920 when the upper viscoelastic film 910 is bonded to the lower viscoelastic film 920 by hot pressing.

Referring to FIG. 31, the flexible LED display module according to the 3-4$^{th}$ embodiment where the irregular pattern consisting of the concave portions 924 and the convex portions 925 is formed in the lower portion of the lower viscoelastic film 920 can be curved with a larger curvature (i.e. a smaller radius of curvature) than the flexible LED display module according to the 3-1$^{st}$ embodiment where the irregular pattern consisting of the concave portions 924 and the convex portions 925 is not formed in the lower portion of the lower viscoelastic film 920. This is because when the flexible LED display module according to the 3-4$^{th}$ embodiment is bent, the width of the concave portions 924 (i.e. the gap between the adjacent convex portions 925) decreases, allowing the flexible LED display module to be curved with a larger curvature.

The formation of the irregular pattern consisting of the concave portions 924 and the convex portions 925 in the lower portion of the lower viscoelastic film 920 enables the manufacture of a rollable LED display panel.

What is claimed is:

1. A Light Emissive Diode (LED) display panel comprising inner LED display modules and outer LED display modules wherein each of the inner LED display modules and the outer LED display modules comprises a first flexible circuit board and a second flexible circuit board arrayed in a row in the lengthwise direction and on which LEDs are arrayed, and an upper viscoelastic film and a lower viscoelastic film bonded to each other through the first flexible circuit board and the second flexible circuit board;
    each of the first flexible circuit board and the second flexible circuit board comprises a folded edge portion and an unfolded edge portion opposite to the folded edge portion;
    a controller unit is disposed under the folded edge portion of each of the first flexible circuit board and the second flexible circuit board to control the LEDs; and
    the folded edge portion of the first flexible circuit board faces the folded edge portion of the second flexible circuit board in each of the inner LED display modules.

2. The LED display panel according to claim 1, wherein the folded edge portion of the first flexible circuit board faces the folded edge portion of the second flexible circuit board in each of the outer LED display modules.

3. The LED display panel according to claim 1, wherein the folded edge portion of the first flexible circuit board faces the unfolded edge portion of the second flexible circuit board in each of the outer LED display modules.

4. The LED display panel according to claim 1, wherein each of the inner LED display modules and the outer LED display modules comprises cut surfaces formed by cutting the upper viscoelastic film and the lower viscoelastic film around the unfolded edge portions.

5. The LED display panel according to claim 4, wherein the inner LED display modules are arranged such that the cut surfaces of the adjacent inner LED display modules are in contact with each other or the cut surfaces of the inner LED display modules are in contact with the cut surfaces of the adjacent outer LED display modules.

6. The LED display panel according to claim 4, wherein the distance between each of the cut surfaces and the center of the LED closest to the cut surface is half (½) the pitch of the LEDs.

7. The LED display panel according to claim 1, wherein the controller unit comprises a drive IC or a controller board.

8. The LED display panel according to claim 1, wherein the upper viscoelastic film comprises through holes through which the LEDs are exposed.

9. The LED display panel according to claim 8, wherein the height of the through holes of the upper viscoelastic film is equal to or lower than that of the upper surfaces of the LEDs.

10. The LED display panel according to claim 1, wherein the upper viscoelastic film and the lower viscoelastic film are made of urethane rubber materials.

11. The LED display panel according to claim 1, wherein each of the inner LED display modules and the outer LED display modules comprises a third flexible circuit board adjacent to the first flexible circuit board in the widthwise direction and a fourth flexible circuit board adjacent to the second flexible circuit board in the widthwise direction and adjacent to the third flexible circuit board in the lengthwise direction; and each of the third flexible circuit board and the fourth flexible circuit board comprises a folded edge portion and an unfolded edge portion opposite to the folded edge portion.

12. The LED display panel according to claim 1, wherein the folded edge portion comprises a first portion having an upper surface on which some of the LEDs are located and a second portion folded on and facing the lower surface of the first portion and on which the controller unit is placed.

13. A Light Emissive Diode (LED) display module comprising: a first flexible circuit board and a second flexible circuit board arrayed in a row in the lengthwise direction and on which LEDs are arrayed; and an upper viscoelastic film and a lower viscoelastic film bonded to each other through the first flexible circuit board and the second flexible circuit board, wherein each of the first flexible circuit board and the second flexible circuit board comprises a folded edge portion and an unfolded edge portion opposite to the folded edge portion, a controller unit is disposed under the folded edge portion of each of the first flexible circuit board and the second flexible circuit board to control the LEDs, and the upper viscoelastic film comprises through holes through which the LEDs are exposed.

14. The LED display module according to claim 13, wherein the folded edge portion of the first flexible circuit board faces the folded edge portion of the second flexible circuit board; and the distance between the center of a first LED located in the folded edge portion of the first flexible circuit board and the center of a second LED located adjacent to the first LED in the folded edge portion of the second flexible circuit board is the same as the pitch of the LEDs arrayed on the first flexible circuit board.

15. The LED display module according to claim 13, wherein the folded edge portion of the first flexible circuit board faces the unfolded edge portion of the second flexible circuit board; and the distance between the center of a first LED located in the folded edge portion of the first flexible circuit board and the center of a second LED located adjacent to the first LED in the unfolded edge portion of the second flexible circuit board is the same as the pitch of the LEDs arrayed on the first flexible circuit board.

16. The LED display module according to claim 13, wherein the height of the through holes of the upper viscoelastic film is equal to or lower than that of the upper surfaces of the LEDs.

17. The LED display module according to claim 13, wherein the LED display module comprises cut surfaces formed by cutting the upper viscoelastic film and the lower viscoelastic film around the unfolded edge portions.

18. The LED display module according to claim 17, wherein the distance between each of the cut surfaces and the center of the LED closest to the cut surface is half (½) the pitch of the LEDs.

19. The LED display module according to claim 13, further comprising a third flexible circuit board adjacent to the first flexible circuit board in the widthwise direction and a fourth flexible circuit board adjacent to the second flexible circuit board in the widthwise direction and adjacent to the third flexible circuit board in the lengthwise direction; and each of the third flexible circuit board and the fourth flexible circuit board comprises a folded edge portion and an unfolded edge portion opposite to the folded edge portion.

20. The LED display module according to claim 13, wherein the folded edge portion comprises a first portion on which some of the LEDs are located and a second portion folded on the first portion and on which the controller unit is placed.

* * * * *